US012224607B2

(12) United States Patent
Fujihara et al.

(10) Patent No.: US 12,224,607 B2
(45) Date of Patent: Feb. 11, 2025

(54) CONTAINING DEVICE

(71) Applicant: HONDA MOTOR CO., LTD., Tokyo (JP)

(72) Inventors: Naoki Fujihara, Wako (JP); Noriyuki Ishida, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 586 days.

(21) Appl. No.: 17/611,592

(22) PCT Filed: May 21, 2020

(86) PCT No.: PCT/JP2020/020130
§ 371 (c)(1),
(2) Date: Nov. 16, 2021

(87) PCT Pub. No.: WO2020/235637
PCT Pub. Date: Nov. 26, 2020

(65) Prior Publication Data
US 2022/0151096 A1    May 12, 2022

(30) Foreign Application Priority Data
May 21, 2019   (JP) .................. 2019-095583

(51) Int. Cl.
*H02J 7/00* (2006.01)
*H05K 5/02* (2006.01)
*H01M 10/46* (2006.01)

(52) U.S. Cl.
CPC .......... *H02J 7/0044* (2013.01); *H05K 5/0214* (2022.08); *H05K 5/023* (2013.01); *H01M 10/46* (2013.01)

(58) Field of Classification Search
CPC .... H02J 7/0044; H02J 7/0045; H05K 5/0214; H05K 5/023; H01M 10/46
See application file for complete search history.

(56) References Cited

U.S. PATENT DOCUMENTS

2005/0078834 A1   4/2005  Hirschburger et al.
2015/0171632 A1*  6/2015  Fry ...................... H02J 7/0042
                                                                307/22
(Continued)

FOREIGN PATENT DOCUMENTS

JP    2007-511931    5/2007
JP    2013-131707    7/2013
(Continued)

OTHER PUBLICATIONS

Extended European Search Report for European Patent Application No. 20809202.3 dated Feb. 1, 2023.
(Continued)

*Primary Examiner* — Hoa C Nguyen
*Assistant Examiner* — Amol H Patel
(74) *Attorney, Agent, or Firm* — Amin, Turocy & Watson, LLP

(57) ABSTRACT

A containing device equipped with: a casing formed in a substantially polyhedral shape, the casing having six substantially quadrilateral faces facing mutually different directions; and a containing part formed in the casing, the containing part containing a contained object so as to be insertable/removable. An opening continuous with the containing part, or a peripheral edge part of an opening continuous with the containing part, is disposed at a position corresponding to a first side, which is one of a plurality of sides constituting a polyhedron that corresponds to the casing.

14 Claims, 21 Drawing Sheets

(56) References Cited

U.S. PATENT DOCUMENTS

2019/0393627 A1    12/2019  Etsunagi et al.
2020/0343748 A1*   10/2020  Ho .......................... H02J 7/00

FOREIGN PATENT DOCUMENTS

| JP | 6286084      | 2/2018  |
| JP | 2018-195492  | 12/2018 |
| JP | 2019-068552  | 4/2019  |

OTHER PUBLICATIONS

Fred Lambert, "Electrek", Jan. 10, 2018 (Jan. 10, 2018), XP002806857, Retrieved from the Internet: URL:https://electrek.co/2018/01/10/honda-battery-pack-ecosystem-electric-products-atv-utv/ [retrieved on Jun. 20, 2022].

International Search Report and Written Opinion for International Application No. PCT/JP2020/020130 mailed on Aug. 4, 2020, 9 pages.

Japanese Office Action for Japanese Patent Application No. 2021-520847 dated May 28, 2024.

* cited by examiner

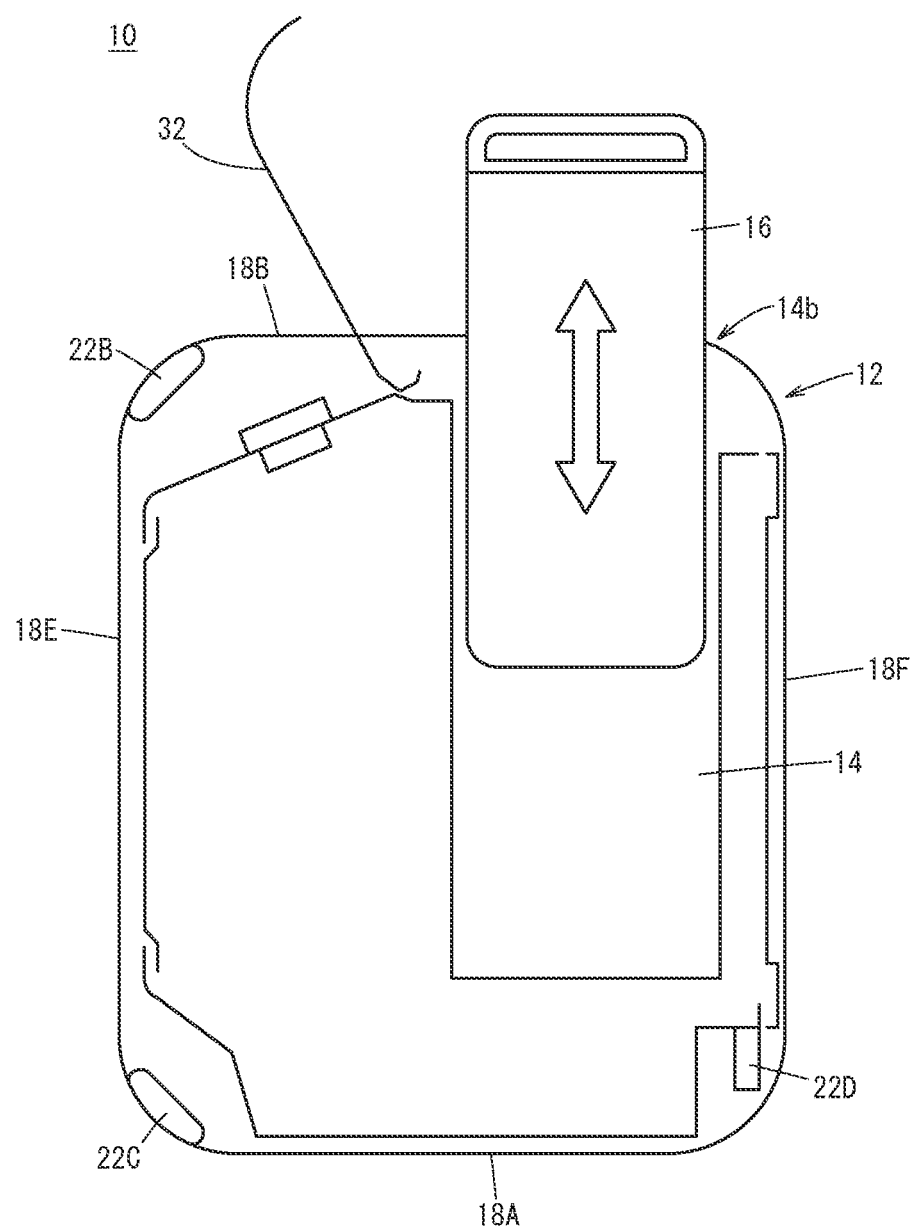

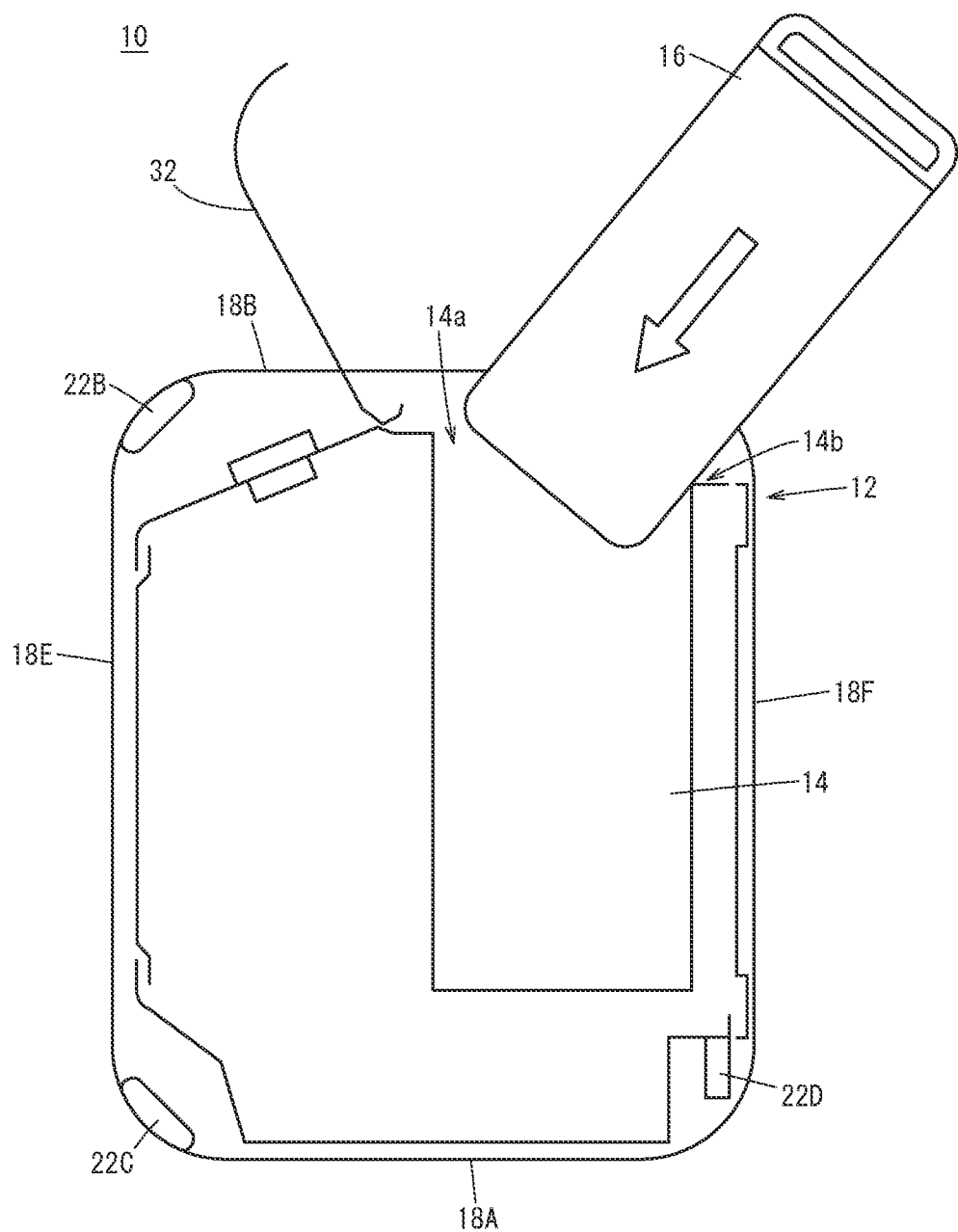

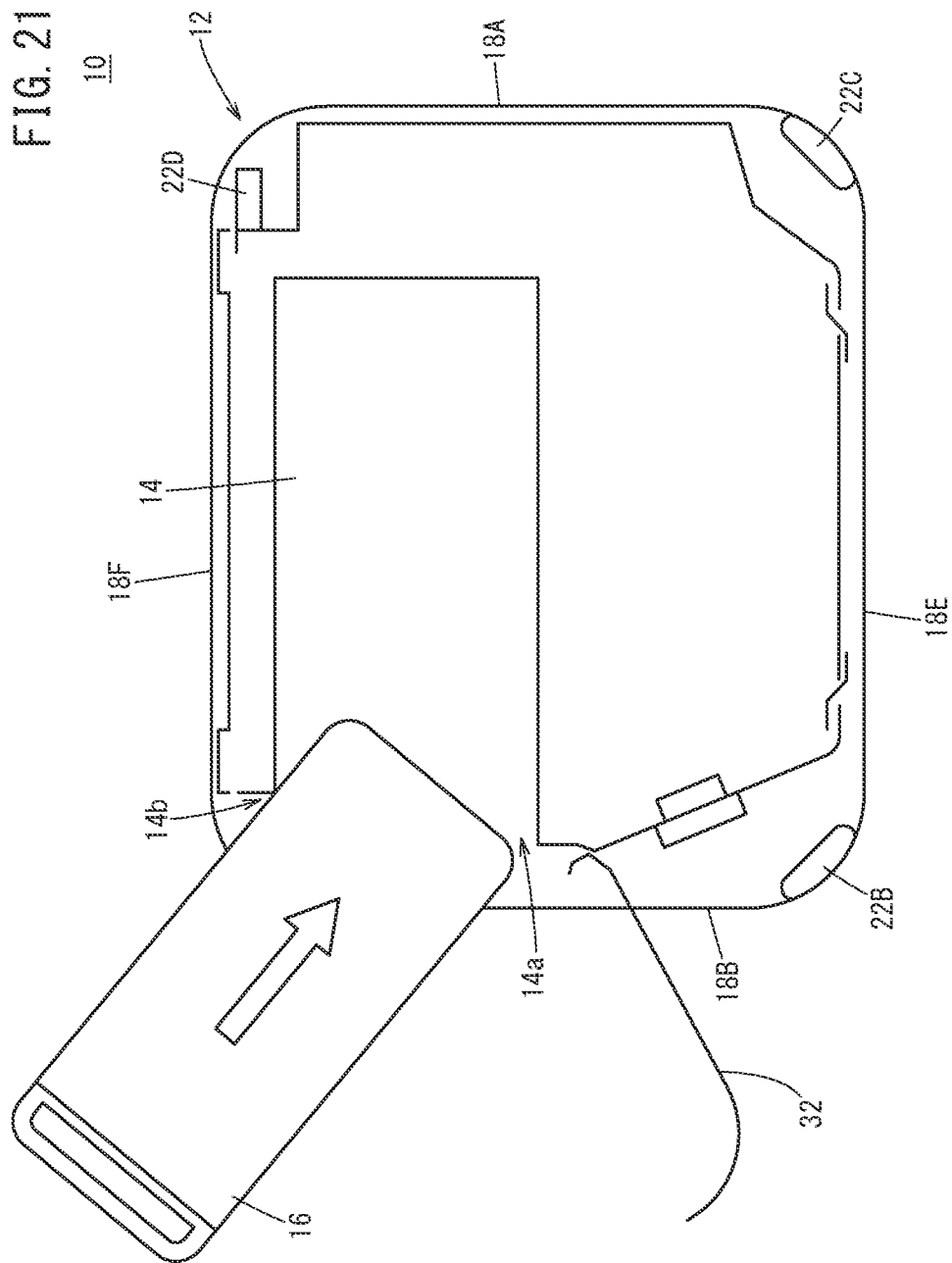

CONTAINING DEVICE

TECHNICAL FIELD

The present invention relates to a containing device.

BACKGROUND ART

Recently, focus has been placed on portable charging power supply devices. JP 2019-068552 A discloses a portable charging power supply device that can supply power over a long period of time while having an improved design.

SUMMARY OF THE INVENTION

However, there is demand for providing a better containing device.

The objective of the present invention is to provide a better containing device.

A containing device according to one aspect of the present invention includes a casing that has a substantially polyhedral shape and includes six substantially quadrangular surfaces facing different directions from each other, and a containing portion that is formed in the casing and contains a contained item in an insertable and removable manner, wherein an opening continuous with the containing portion, or a peripheral edge portion of an opening continuous with the containing portion, is arranged at a position corresponding to a first edge, which is one of a plurality of edges forming a polyhedron corresponding to the casing.

A containing device according to another aspect of the present invention includes a casing that has a substantially polyhedral shape and includes six substantially quadrangular surfaces facing different directions from each other, a containing portion that is formed in the casing and contains a contained item in an insertable and removable manner, an opening continuous with the containing portion, two outer marginal members provided at positions corresponding to two surfaces that are parallel to each other among the six surfaces of the casing, the two outer marginal members forming outer margins of the two surfaces, respectively, and a connecting portion configured to connect the two outer marginal members to each other, provided at a position corresponding to an edge parallel to a normal direction of the two surfaces, among a plurality of edges forming a polyhedron corresponding to the casing.

According to the present invention, it is possible to provide a better containing device.

BRIEF DESCRIPTION OF DRAWINGS

FIGS. 5A, 5B, 50, 5D, 5E and 5F are six orthogonal views of the containing device according to an embodiment;

FIG. 19 shows an example of inserting or removing the contained item into or from a containment chamber;

FIG. 20 shows an example of inserting the contained item into the containment chamber; and FIG. 21 shows an example of inserting the contained item into the containment chamber.

DESCRIPTION OF THE INVENTION

Preferred embodiments of a containing device according to the present invention will be presented and described below with reference to the accompanying drawings.

Embodiment

Figure 1:
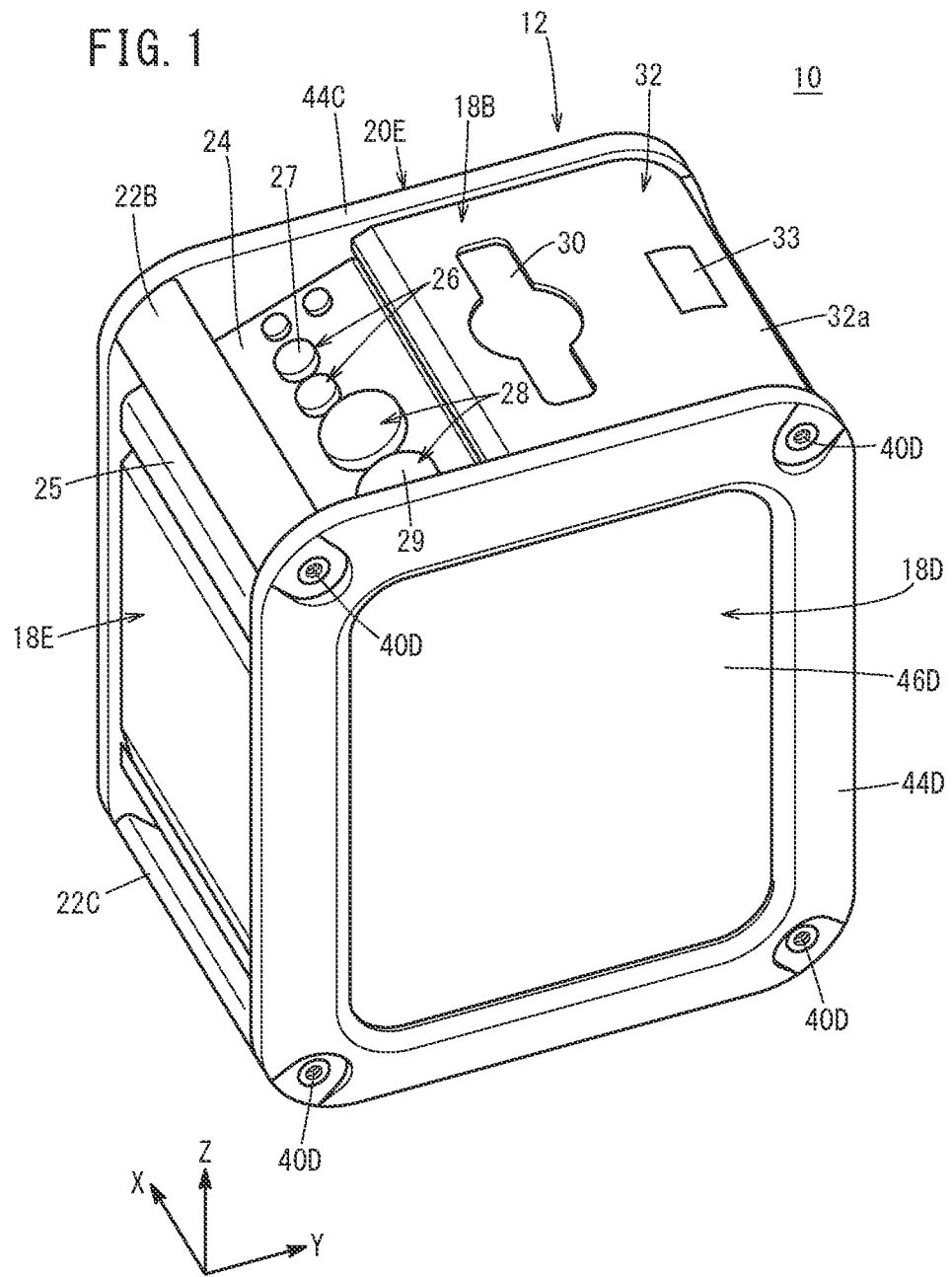
FIG. 1 is a perspective view of a containing device according to an embodiment.

A containing device according to one embodiment will be described using drawings. FIG. 1 is a perspective view of the containing device according to the present embodiment. Here, an example is described of a case in which a containing device 10 is the charging power supply device, but the present invention is not limited to this.

As shown in FIG. 1, the containing device 10 includes a casing 12. The shape of the casing 12 is substantially polyhedral. More specifically, the shape of the casing 12 is substantially a rectangular parallelepiped. As shown in FIG. 1, each vertex and each edge of the casing 12 are filleted. That is, each vertex and each edge of the casing 12 are made to have a rounded shape.

Figure 2:
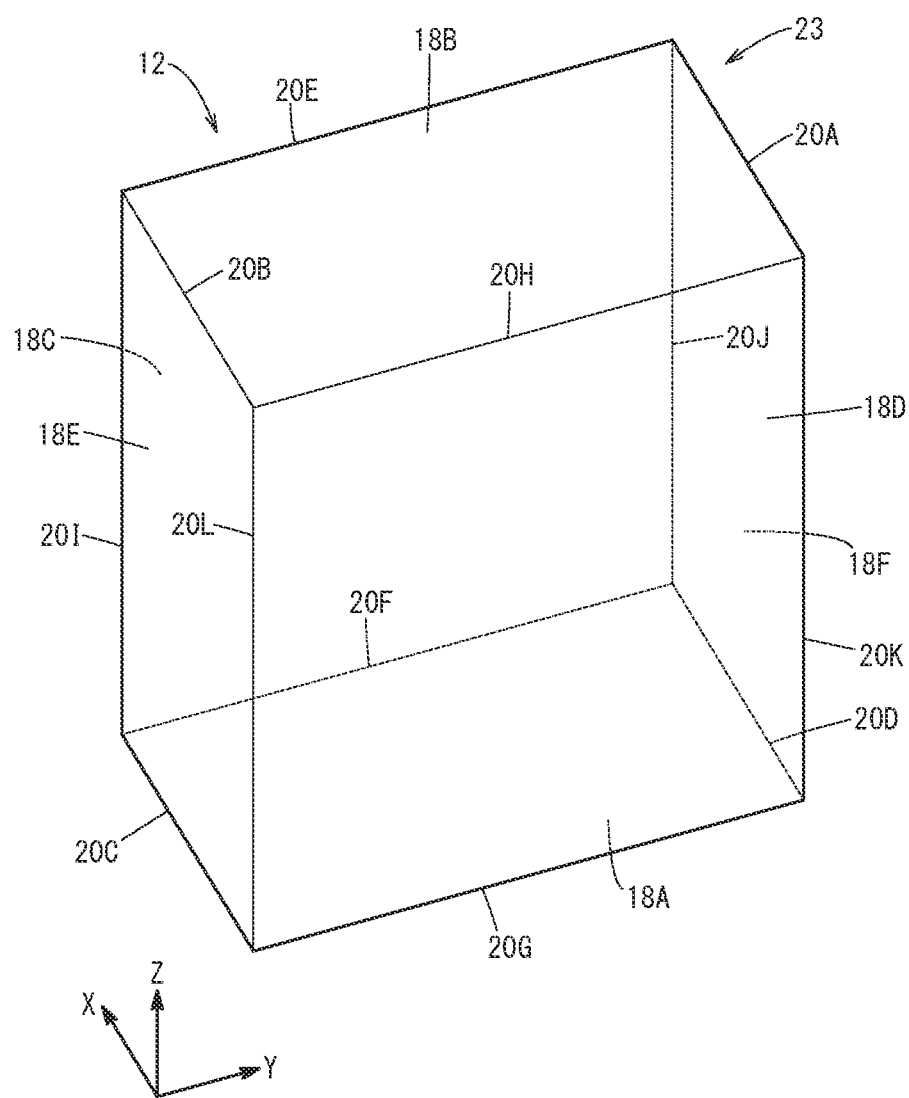
FIG. 2 shows a model of a rectangular parallelepiped corresponding to the casing of the containing device according to an embodiment.

FIG. 2 shows a model of a rectangular parallelepiped corresponding to the casing of the containing device according to the present embodiment. As shown in FIG. 2, a polyhedron 23 corresponding to the casing 12 includes a bottom surface (floor surface) 18A, a top surface 18B, a left-side surface (side surface) 18C, a right-side surface (side surface) 18D, a front surface (front-side surface, side surface) 18E, and a rear surface (rear-side surface, side surface) 18F. In other words, the polyhedron 23 corresponding to the casing 12 has six surfaces 18A to 18F, for example. The polyhedron 23 corresponding to the casing 12 is rectangular parallelepiped, for example, but is not limited to this. The polyhedron 23 corresponding to the casing 12 may be a parallelepiped or the like. That is, the shape of the casing 12 may be substantially a parallelepiped. The reference numeral 18 is used when describing a surface in general, and the reference numerals 18A to 18F are used when describing each individual surface.

The left-side surface 18C, the right-side surface 18D, the front surface 18E, and the rear surface 18F are bent from and continuous with the bottom surface 18A. Furthermore, the left-side surface 18C, the right-side surface 18D, the front surface 18E, and the rear surface 18F are bent from and continuous with the top surface 18B. The bottom surface 18A and the top surface 18B are aligned with each other. That is, the bottom surface 18A and the top surface 18B are parallel to each other. In other words, the normal direction of the bottom surface 18A and the normal direction of the top surface 18B are aligned with each other. The left-side surface 18C and the right-side surface 18D are aligned with each other. In other words, the normal direction of the left-side surface 18C and the normal direction of the right-side surface 18D are aligned with each other. The front surface 18E and the rear surface 18F are aligned with each other. In other words, the normal direction of the front surface 18E and the normal direction of the rear surface 18F are aligned with each other.

The direction from the left-side surface 18C toward the right-side surface 18D or the direction from the right-side surface 18D to the left-side surface 18C is a width direction (X direction). The direction from the front surface 18E toward the rear surface 18F or the direction from the rear surface 18F toward the front surface 18E is a depth direction (Y direction). The direction from the bottom surface 18A toward the top surface 18B or the direction from the top surface 18B toward the bottom surface 18A is a height direction (Z direction).

The polyhedron 23 corresponding to the casing 12 has twelve edges 20A to 20L. The edge 20A is positioned at the region (portion, location) where the top surface 18B and the rear surface 18F intersect. The edge 20B is positioned at the region where the top surface 18B and the front surface 18E intersect. The edge 20C is positioned at the region where the bottom surface 18A and the front surface 18E intersect. The edge 20D is positioned at the region where the bottom surface 18A and the rear surface 18F intersect. The edges 20A to 20D are aligned with each other.

The edge 20E is positioned at the region where the top surface 18B and the left-side surface 18C intersect. The edge 20F is positioned at the region where the bottom surface 18A and the left-side surface 18C intersect. The edge 20G is positioned at the region where the bottom surface 18A and the right-side surface 18D intersect. The edge 20H is positioned at the region where the right-side surface 18D and the top surface 18B intersect. The edges 20E to 20H are aligned with each other.

The edge 20I is positioned at the region where the front surface 18E and the left-side surface 18C intersect. The edge 20J is positioned at the region where the left-side surface 18C and the rear surface 18F intersect. The edge 20K is positioned at the region where the rear surface 18F and the right-side surface 18D intersect. The edge 20L is positioned at the region where the front surface 18E and the right-side surface 18D intersect. The edges 20I to 20L are aligned with each other.

Figure 3:
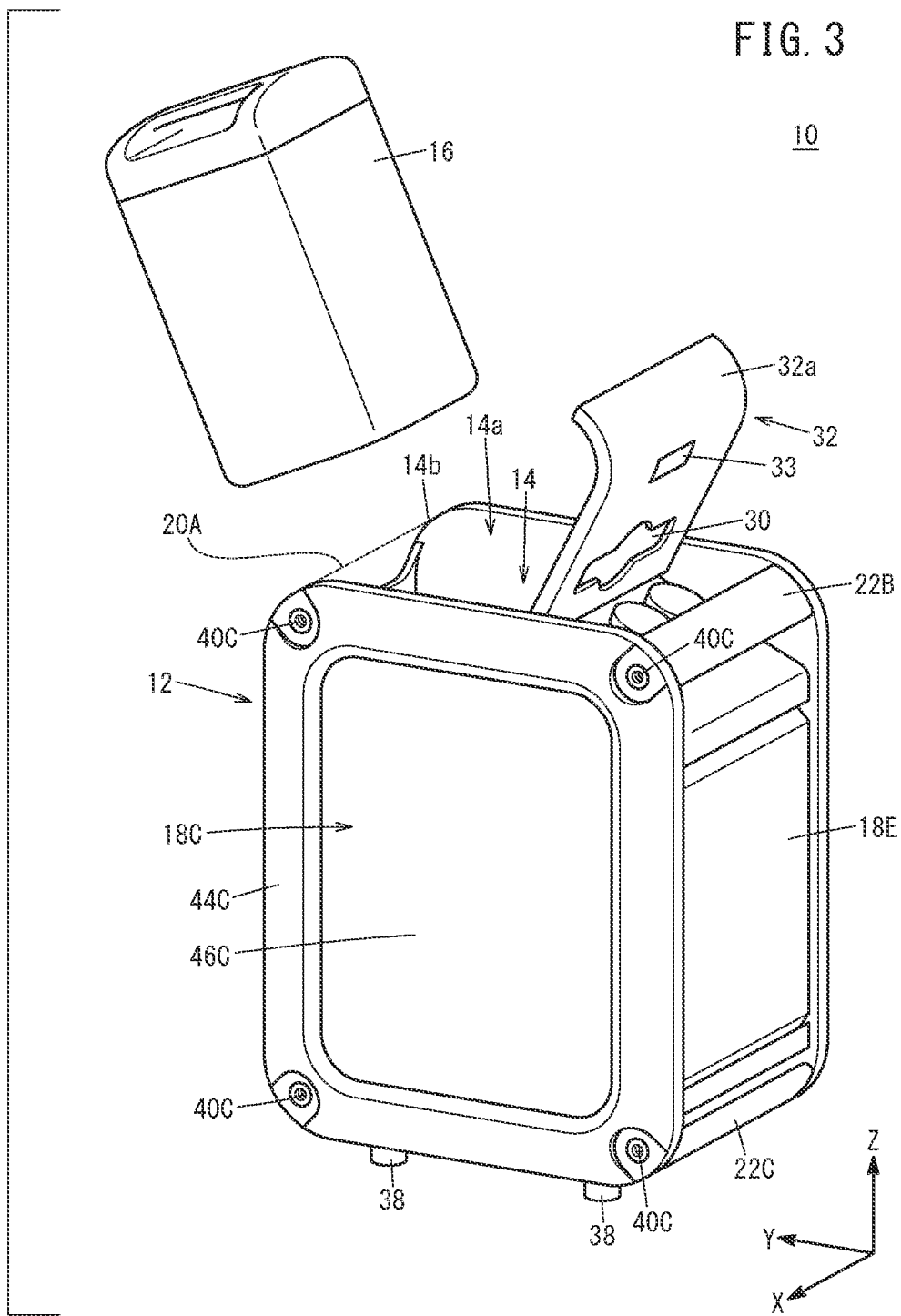
FIG. 3 is a perspective view of the containing device according to an embodiment.

FIG. 3 is a perspective view of the containing device according to the present embodiment. As shown in FIG. 3, the casing 12 includes a containment chamber 14 (containment portion). A contained item 16 can be contained inside the containment chamber 14. Here, an example is described of a case where the contained item 16 is a battery (i.e., an electrical energy storage device), but the present invention is not limited to this. The contained item 16 can be inserted into and removed from the containment chamber 14.

As shown in FIGS. 1 and 3, a cover portion (covering member, cover, configurational member) 32 that covers an opening 14a continuous with the containment chamber 14 is included on the top portion of the casing 12. The configurational member 32 is arranged such that the outermost end (outer surface) of the cover portion (i.e., the configurational member 32) in the normal direction of the top surface 18B, is located more inwardly than the outermost end portions of outer marginal members 44C and 44D in this normal direction. The cover portion 32 includes an open button 33. When the open button 33 is pressed by a user, the cover portion 32 opens. FIG. 1 shows a state in which the cover portion 32 is closed. FIG. 3 shows a state in which the cover portion 32 is open. As shown in FIG. 1, the cover portion 32 includes an indicator 30 that indicates the remaining amount of the contained item 16. The cover portion 32 is capable of pivoting on a pivoting shaft 31 (see FIG. 8) provided to the top surface 18B. This pivoting shaft 31 is provided on the side of a recessed portion 24 described further below. The pivoting shaft 31 is arranged at a position avoiding the edge 20A. Furthermore, the pivoting shaft 31 is arranged at a position avoiding the plurality of edges 20A to 20L forming the polyhedron 23 corresponding to the casing 12. By having the cover portion 32 pivot on the pivoting shaft 31, the containment chamber 14 can be opened and closed. As shown in FIG. 3, when the cover portion 32 is open, the user can insert and remove the contained item 16 into and from the containment chamber 14. As shown in FIG. 1, when the cover portion 32 is closed, one end of the cover portion 32 is near the top end of the rear surface 18F. In other words, when the cover portion 32 is closed, the one end of the cover portion 32 is positioned near the location corresponding to the edge 20A. The cover portion 32 includes a curved portion 32a. When the cover portion 32 is closed, the curved portion 32a is positioned at a location corresponding to the edge 20A.

As shown in FIG. 2, the edge 20A is positioned at one side of the rear surface 18F, namely the top side. In other words, the edge 20A is positioned at one side of the top surface 18B, namely the rear side. As shown in FIGS. 2 and 3, the opening 14a continuous with the containment chamber 14, or a peripheral edge portion 14b of the opening 14a continuous with the containment chamber 14, is positioned at the location corresponding to the edge 20A.

As shown in FIG. 2, the edge 20B is positioned at one side of the front surface 18E, namely the top side. In other words, the edge 20B is positioned at the other side of the top surface 18B, namely the front side. As described above, the edge 20B is aligned with the edge 20A. As shown in FIG. 1, a handle portion (first handle portion, bar, support portion, or grip) 22B is included at the region corresponding to the edge 20B. The handle portion 22B extends in the width direction, i.e., the X direction. The handle portion 22B includes a gripping portion 21B (see FIG. 7) having a cross-section formed with an annular shape. The handle portion 22B can function as a connecting portion that connects the outer marginal member 44C and the outer marginal member 44D, described further below, to each other.

As shown in FIG. 2, the edge 20C is positioned at the other side of the front surface 18E, namely the bottom side. In other words, the edge 20C is positioned at the one side of the bottom surface 18A, namely the front side. As described above, the edge 20C is aligned with the edge 20A. As shown in FIG. 1, a handle portion (second handle portion, bar, support portion, or grip) 22C is included at the region corresponding to the edge 20C. The handle portion 22C extends in the width direction, i.e., the X direction. The handle portion 22C includes a gripping portion 21C (see FIG. 7) having a cross-section formed with an annular shape. The handle portion 22C can function as a connecting portion that connects the outer marginal member 44C and the outer marginal member 44D, described further below, to each other.

Figure 4:
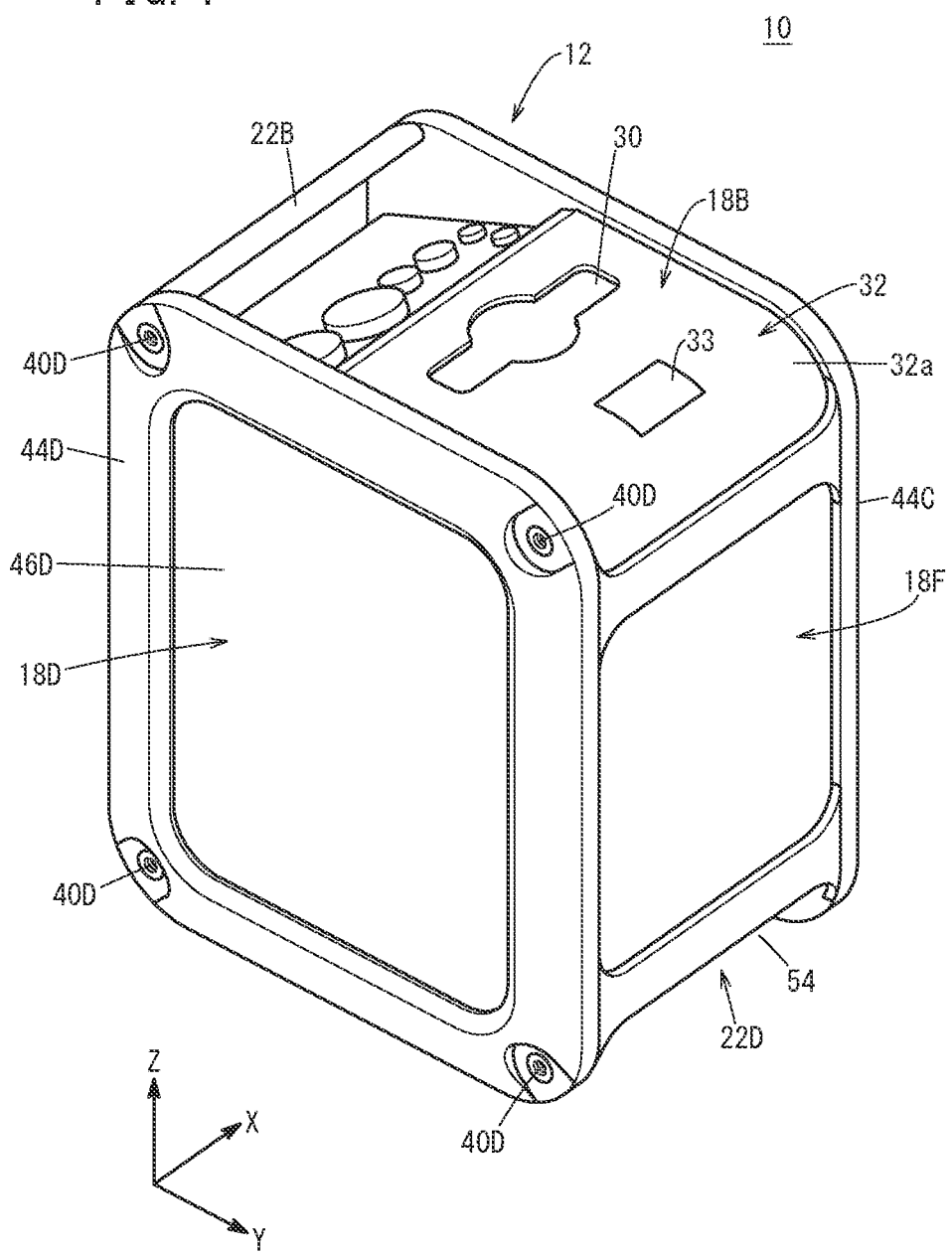
FIG. 4 is a perspective view of the containing device according to an embodiment.
Figure 7:
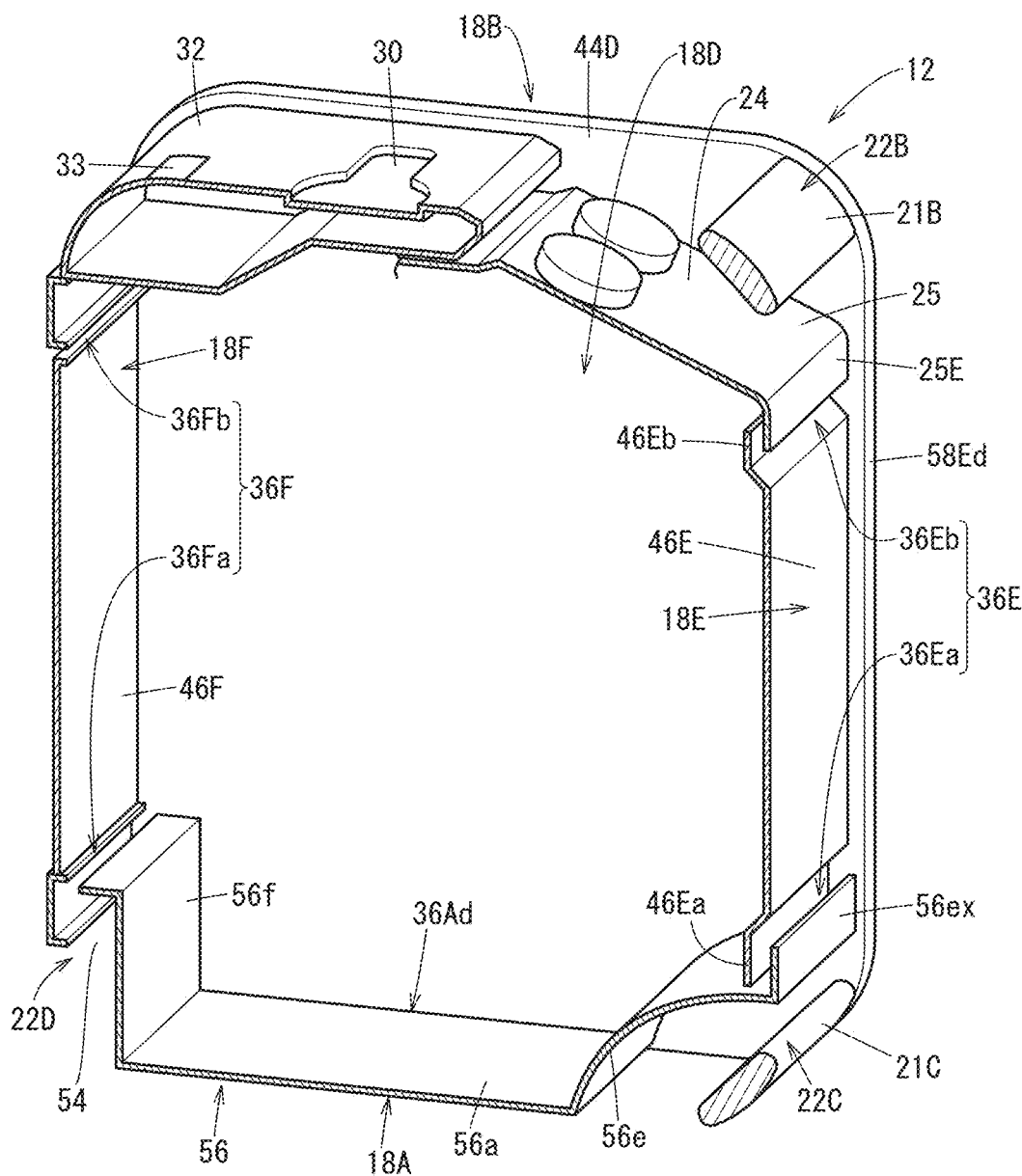
FIG. 7 is a cross-sectional perspective view of the containing device according to an embodiment.

The edge 20D is positioned at the other side of the rear surface 18F, namely the bottom side. In other words, the edge 20D is positioned at the other side of the bottom surface 18A, namely the rear side. As described above, the edge 20D is aligned with the edge 20A. FIG. 4 is a perspective view of the containing device according to the present embodiment. As shown in FIG. 4, a handle portion (third handle portion, support portion, holding portion, or recessed portion) 22D is included at the region corresponding to the edge 20D. The handle portion 22D extends in the width direction, i.e., the X direction, and is depressed toward the front surface 18E side. In other words, the handle portion 22D is formed by forming a recessed space 54 (see FIG. 4) that is recessed toward the top surface 18B side in the casing 12. The recessed space 54 is defined by a portion 56f (see FIG. 7) described further below. As shown in FIG. 7, the top part of this portion 56f is bent toward the rear surface 18F side. The part of this portion 56f that is bent toward the rear surface 18F side is positioned on the top surface 18B side of the bottom end region of the handle portion 22D. The reference numeral 22 is used when describing a handle portion in general, and the reference numerals 22B to 22D are used when describing each individual handle portion.

As shown in FIG. 1, the recessed portion 24, which has a shape formed by cutting away a part of the top surface 18B and the front surface 18E, is formed near the region corresponding to the edge 20B. The floor portion of the recessed portion 24 is defined by a member 25, one side portion of the recessed portion 24 is formed by part of the outer marginal member 44C described further below, and the other side portion of the recessed portion 24 is formed by part of the outer marginal member 44D described further below. The surface of the member 25 forming the floor portion of the recessed portion 24 is inclined relative to the top surface 18B. Since the recessed portion 24 is formed in this way, the handle portion 22B can be included at the location corresponding to the edge 20B. The member 25 forming the floor portion of the recessed portion 24 includes a USB power output terminal (output terminal or connector) 26 and an AC power output terminal (output terminal or connector) 28. The USB power output terminal 26 and the AC power output terminal 28 are for supplying power from the containing device 10 to an external device. The USB power output terminal 26 can output DC power. The USB power output terminal 26 is, for example, a USB terminal to which a USB cable can be connected. That is, The USB power output terminal 26 is an outlet to which a USB cable can be connected. A load that receives DC power can be connected to the USB power output terminal 26. The AC power output terminal 28 can output AC power. The AC power output terminal 28 is an outlet to which a commercial power supply plug can be connected, for example. A load that receives AC power can be connected to the AC power output terminal 28. Here, an example is described of a case where two USB power output terminals 26 and two AC power output terminals 28 are included, but the number of USB power output terminals 26 and the number of AC power output terminals 28 are not limited to this. FIG. 1 shows a state in which caps 27 and 29 respectively cover the USB power output terminal 26 and the AC power output terminal 28. The caps 27 and 29 are for protecting the USB power output terminal 26 and the AC power output terminal 28, respectively.

Figure 5:
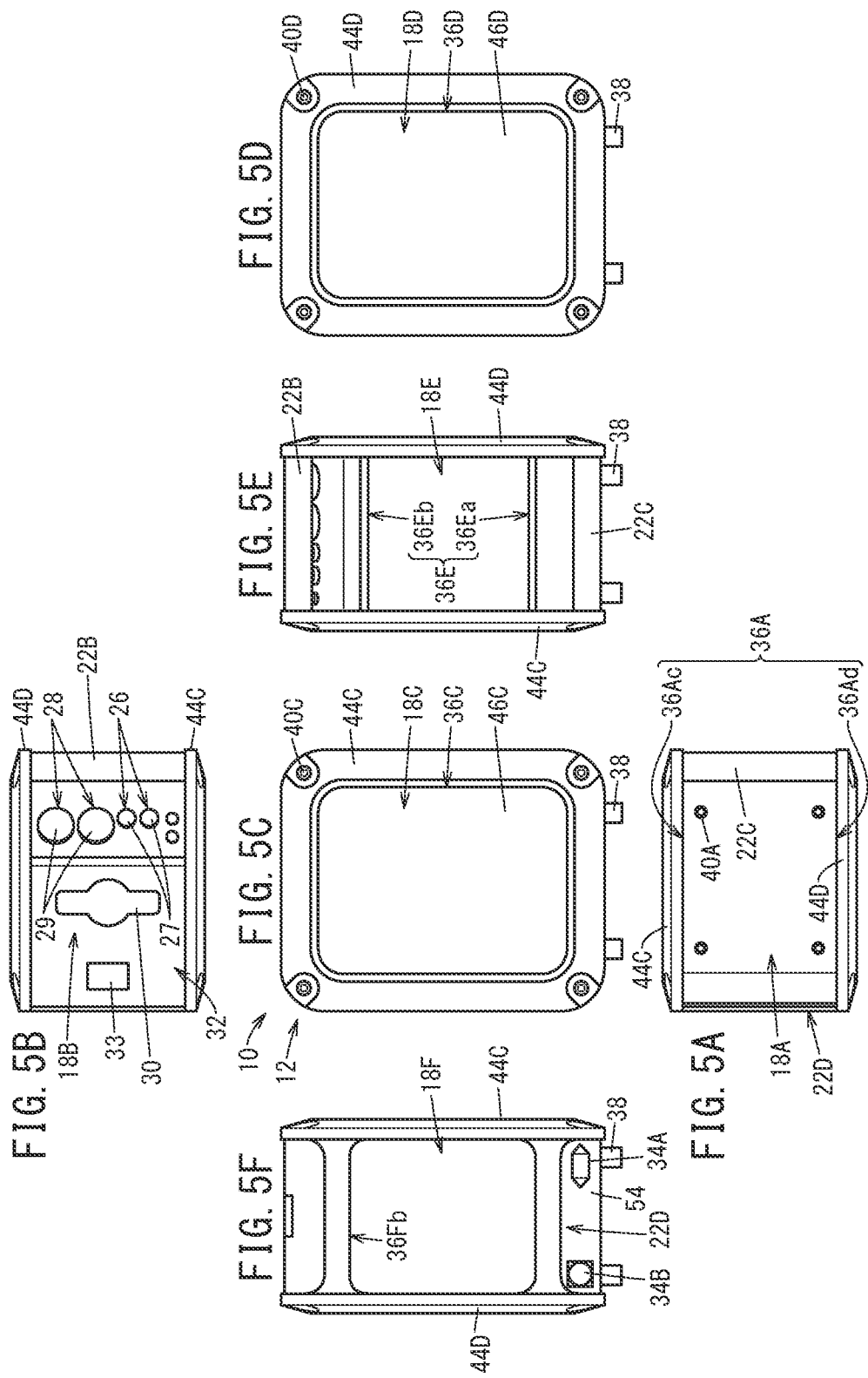

FIGS. 5A to 5F are six orthogonal views of the containing device according to the present embodiment. FIG. 5A is a bottom view, FIG. 5B is a top view, FIG. 5C is a left side view, FIG. 5D is a right side view, FIG. 5E is a front view, and FIG. 5F is a rear view. FIGS. 5C, 5D, 5E, and 5F show grounding protrusions 38 that are described further below, but these grounding protrusions 38 are omitted from FIG. 5A.

As shown in FIG. 5F, an AC power input terminal (input terminal or connector) 34A and a DC power input terminal (input terminal or connector) 34B are included in the recessed space 54. The AC power input terminal 34A and the DC power input terminal 34B are for supplying power to the containing device 10. The AC power input terminal 34A is a socket to which a power supply cable (not shown in the drawings) can be connected. The power supply cable is connected to the AC power input terminal 34A for inputting power supplied from a commercial AC power supply to the containing device 10. The DC power input terminal 34B is a socket to which a power supply cable (not shown in the drawings) can be connected. The power supply cable is connected to the DC power input terminal 34B for inputting DC power to the containing device 10.

Figure 6:
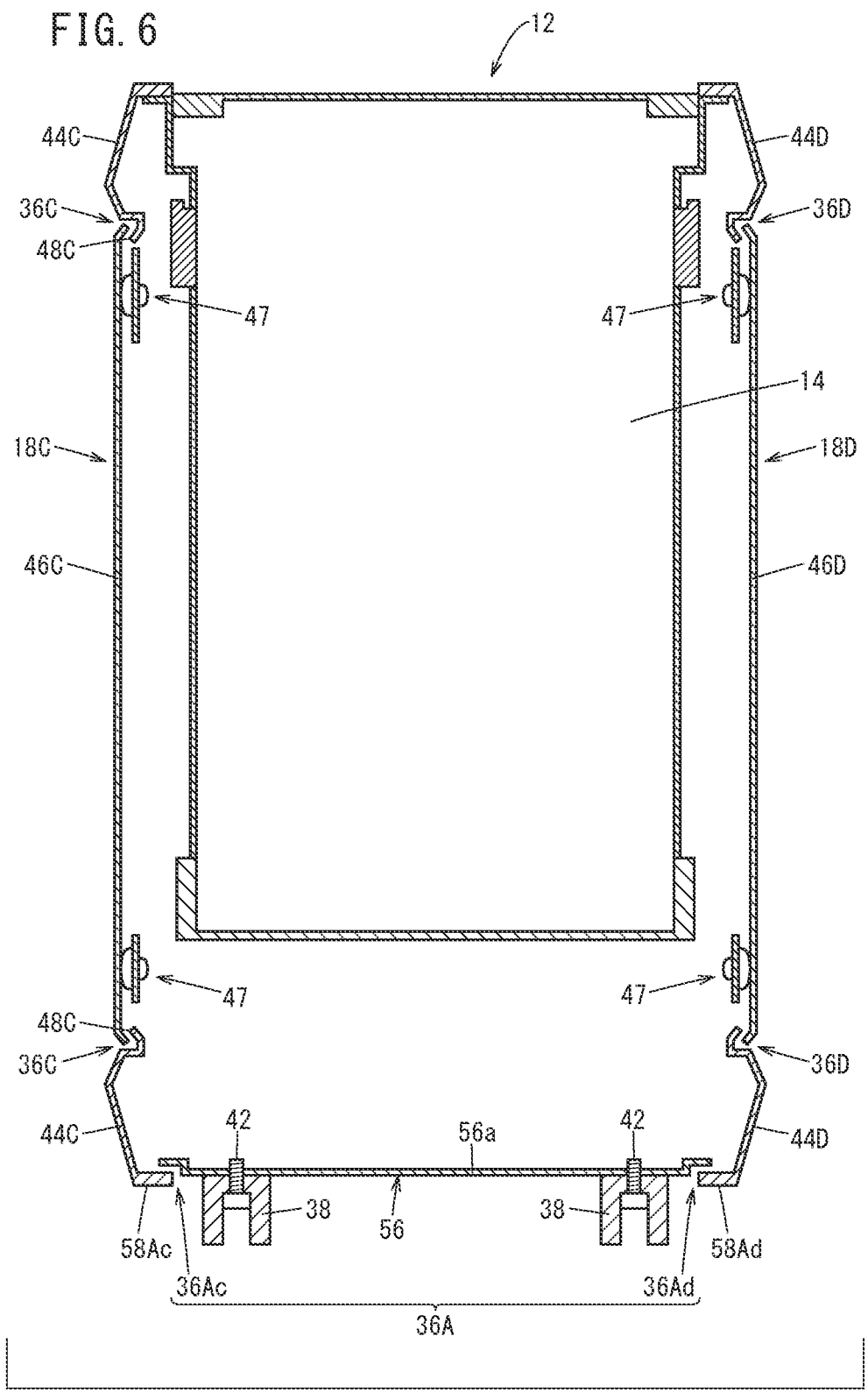
FIG. 6 is a cross-sectional view of the containing device according to an embodiment.

As shown in FIG. 5A, screw holes 40A for attaching the grounding protrusions 38 (see FIG. 3) are included in the bottom surface 18A of the casing 12. FIG. 6 is a cross-sectional view of the containing device according to the present embodiment. As shown in FIG. 6, the grounding protrusions 38 can be attached to the bottom surface 18A of the casing 12 by using screws 42. When the casing 12 is set to the upright position in a state where the grounding protrusions 38 are attached to the bottom surface 18A, the grounding protrusions 38 enter a state of protruding toward the floor (floor surface, loading surface, or installation surface). As shown in FIG. 5C, screw holes 40C for attaching the grounding protrusions 38 are included at the four corners of the outer marginal member 44C, described further below. Furthermore, as shown in FIG. 5D, screw holes 40D for attaching the grounding protrusions 38 are included at the four corners of the outer marginal member 44D, described further below. It is also possible to remove the grounding protrusions 38 from the bottom surface 18A of the casing 12 and attach the grounding protrusions 38 to the four corners of the outer marginal member 44C or the four corners of the outer marginal member 44D.

As shown in FIGS. 5A and 6, a ventilation path (ventilation port, intake port, intake path, or gap) 36A is included in the bottom surface 18A. The ventilation path 36A is formed by a partial ventilation path 36Ac and a partial ventilation path 36Ad. As shown in FIGS. 5C and 6, a ventilation path (ventilation port, intake port, intake path, or gap) 36C is included in the left-side surface 18C. As shown in FIGS. 5D and 6, a ventilation path (ventilation port, intake port, intake path, or gap) 36D is included in the right-side surface 18D.

Figure 8:
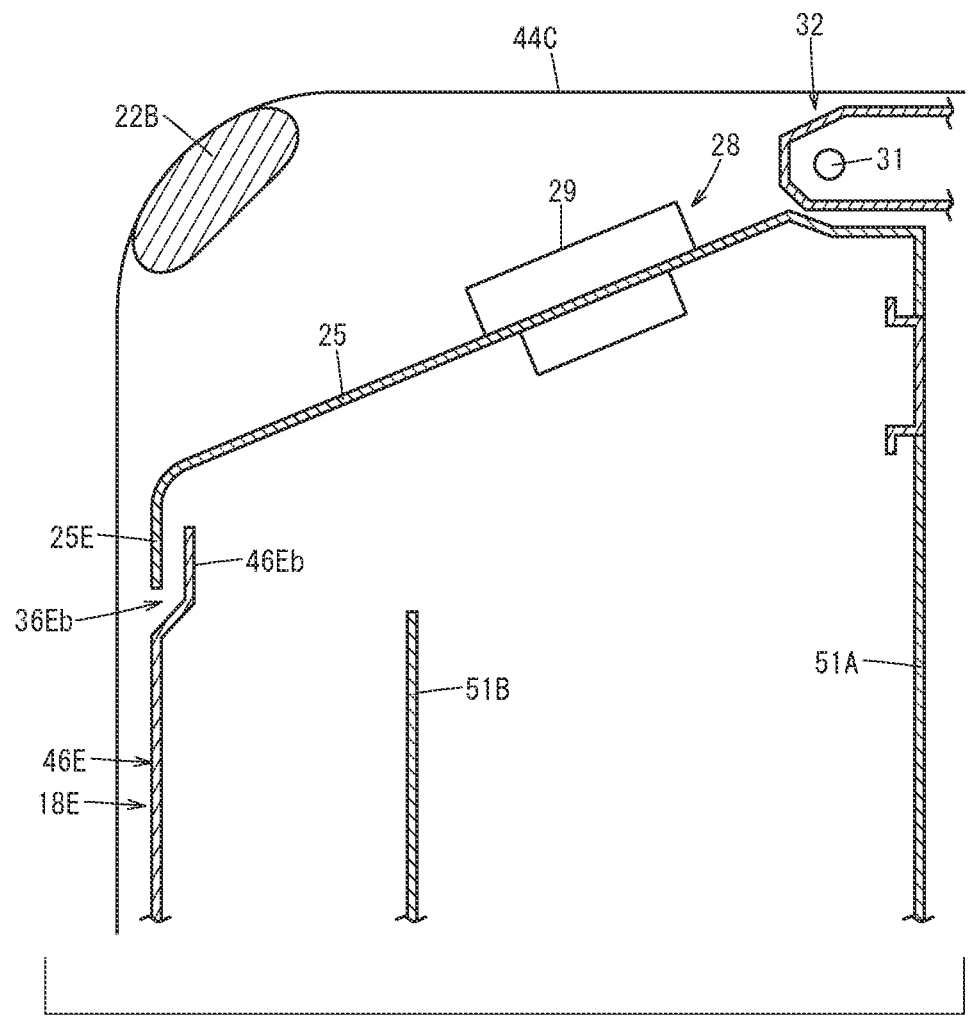
FIG. 8 is a cross-sectional view of a portion of the containing device according to an embodiment.
Figure 9:
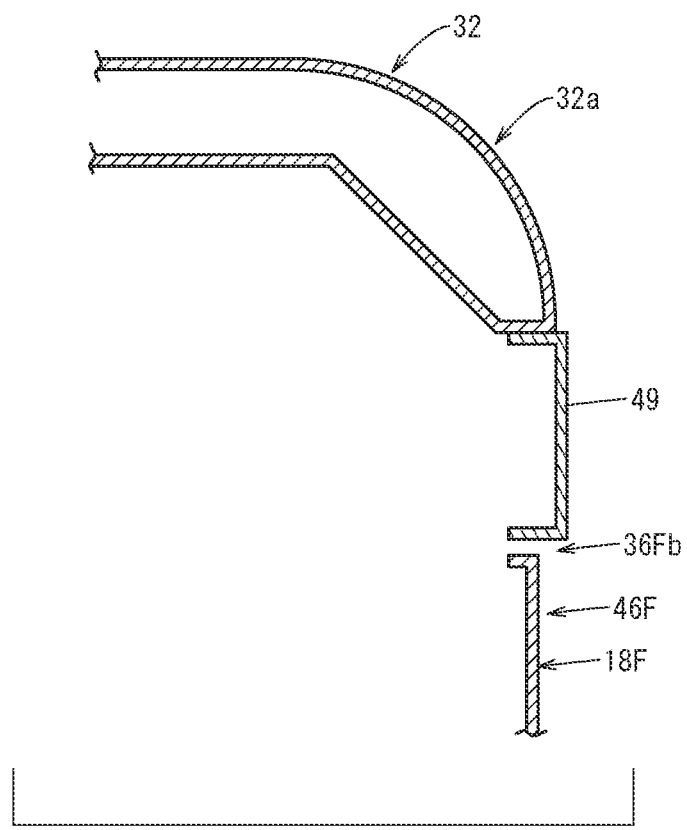
FIG. 9 is a cross-sectional view of a portion of the containing device according to an embodiment.

FIG. 7 is a cross-sectional perspective view of the containing device according to the present embodiment. In FIG. 7, a slit 59 (see FIG. 10) described further below and an opening 57d (see FIG. 10) described further below are omitted from the drawing. FIG. 8 is a cross-sectional view of a portion of the containing device according to the present embodiment. FIG. 8 shows a cross section on the front surface 18E side. FIG. 9 is a cross-sectional view of a portion of the containing device according to the present embodiment. FIG. 9 shows a cross section on the rear surface 18F side. As shown in FIG. 7, a ventilation path (ventilation port, exhaust port, exhaust path, or gap) 36E is included in the front surface 18E. The ventilation path 36E is formed by a partial ventilation path 36Ea and a partial ventilation path 36Eb. As shown in FIG. 7, a ventilation path (ventilation port, intake port, intake path, or gap) 36F is included in the rear surface 18F. The ventilation path 36F is formed by a partial ventilation path 36Fa and a partial ventilation path 36Fb. The reference numeral 36 is used when describing a ventilation path in general, and the reference numerals 36A, 36C, 36D, 36E, and 36F are used when describing each individual ventilation path. According to the present embodiment, the ventilation paths 36A, 36C, 36D, 36E, and 36F are included in the bottom surface 18A, the left-side surface 18C, the right-side surface 18D, the front surface 18E, and the rear surface 18F. Therefore, by using a blower 52 described further below to blow air, it is possible to bring air into the casing 12 via the ventilation paths 36A, 36C, 36D, and 36F, for example, and to expel the air from inside the casing 12 via the ventilation path 36E, for example. Therefore, according to the present embodiment, it is possible to favorably cool the inside of the casing 12.

Figure 10:
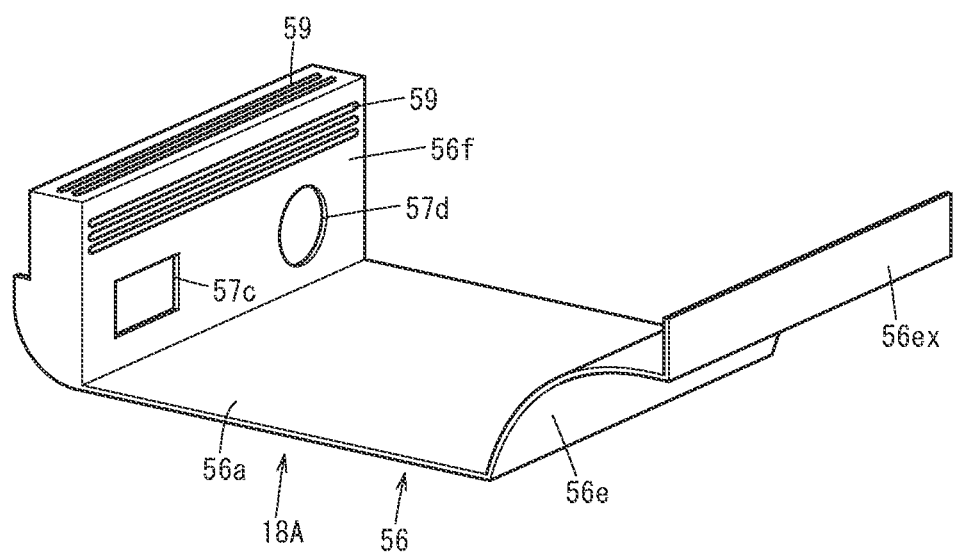
FIG. 10 shows members included on the bottom surface side of the casing.

FIG. 10 shows configurational members included on the bottom surface side of the casing. A configurational member 56 is included on the bottom surface 18A side of the casing 12. That is, the configurational member 56 is included at a position corresponding to the surface 18A that is parallel to the edge 20A. The configurational member 56 includes a board-shaped portion 56a corresponding to the bottom surface 18A. The portion 56f bent from and continuous with this portion 56a is included at one side of the portion 56a, namely the rear surface 18F side. A portion 56e bent from and continuous with this portion 56a is included at the other side of the portion 56a, namely the front surface 18E side. The portion 56f is positioned on the rear surface 18F side, and the portion 56e is positioned on the front surface 18E side. The portion 56f includes an opening 57c, to which the AC power input terminal 34A is attached, and the opening 57d, to which the DC power input terminal 34B is attached. A plurality of slits 59 are formed in the portion 56f. Here, an example is shown of a case where five slits 59 are formed, but the number of slits 59 is not limited to five. As shown in FIG. 6, the configurational member 56 is arranged such that the outermost end (outermost surface) of the configurational member 56 in the normal direction of the surface 18A is located more inwardly than outermost end portions 58Ac and 58Ad of the outer marginal members 44C and 44D in this normal direction.

As shown in FIGS. 5C, 5D, and 6, the casing 12 includes the outer marginal members (frames) 44C and 44D and inner members (side covers or panels) 46C and 46D. The outer marginal members 44C and 44D and the inner members 46C and 46D are included at positions corresponding to the two surfaces 18C and 18D from among the six surfaces 18A to 18F of the casing 12. The normal direction of the surfaces 18C and 18D is the longitudinal direction of the edge 20A. The outer marginal members 44C and 44D respectively form the outer margins of the two surfaces 18C and 18D.

The outer marginal member 44C is formed by a ring-shaped (frame-shaped) member, for example. The inner member 46C is formed by a board-shaped member, for example. The portion of the outer marginal member 44C positioned on the left-side surface 18C forms the outer margin side of the left-side surface 18C. The inner member 46C is included on the inner side of the outer marginal member 44C. The ventilation path 36C is formed between the inner end of the outer marginal member 44C and the outer end of the inner member 46C. The outer margin of the inner member 46C is larger than the inner margin of the outer marginal member 44C. The inner member 46C is fixed to the casing 12 using an inset type of fixing mechanism (fixing structure) 47. The fixing mechanism 47 is included to correspond to the four corners of the inner member 46C, for example. By releasing the fixing realized by the fixing mechanism 47, it is possible to remove the inner member 46C from the casing 12. The portion of the inner member 46C overlapping with the outer marginal member 44C is positioned farther to the outside of the casing 12 relative to the portion of the outer marginal member 44C overlapping with the inner member 46C. Therefore, in the state where the outer marginal member 44C is fixed to the casing 12, it is possible to remove the inner member 46C.

Figure 11A:
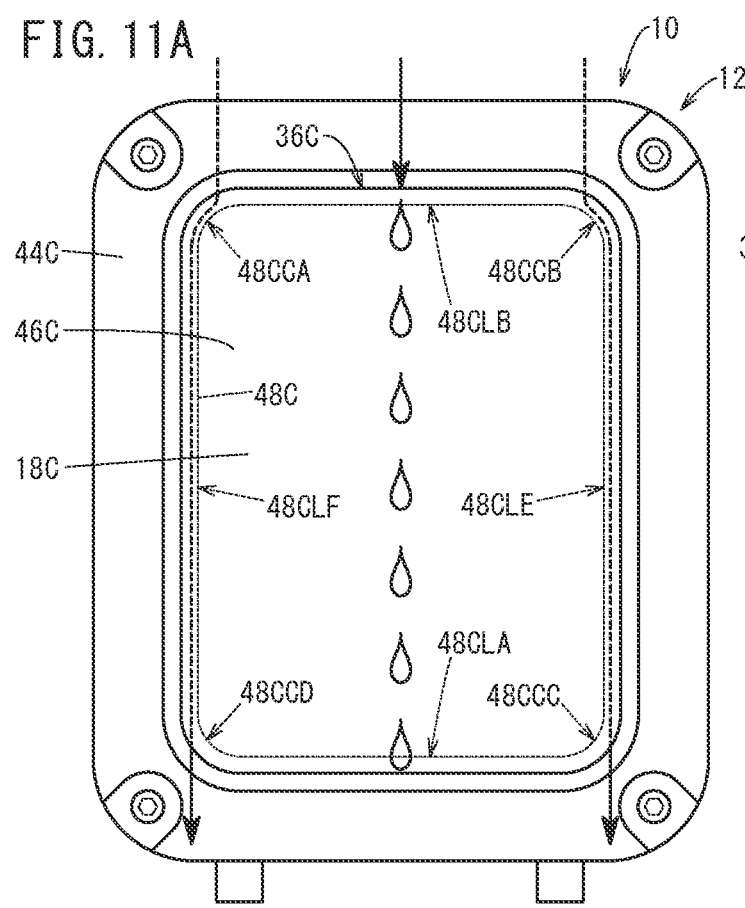
FIGS. 11A, 11B and 11C conceptually show the flow of water.
Figure 11B:
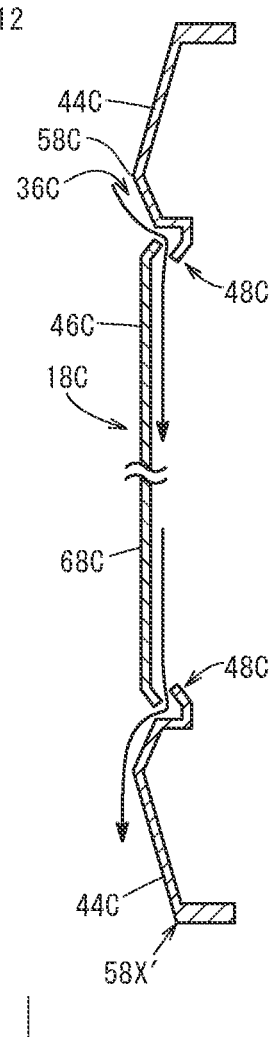
Figure 11C:
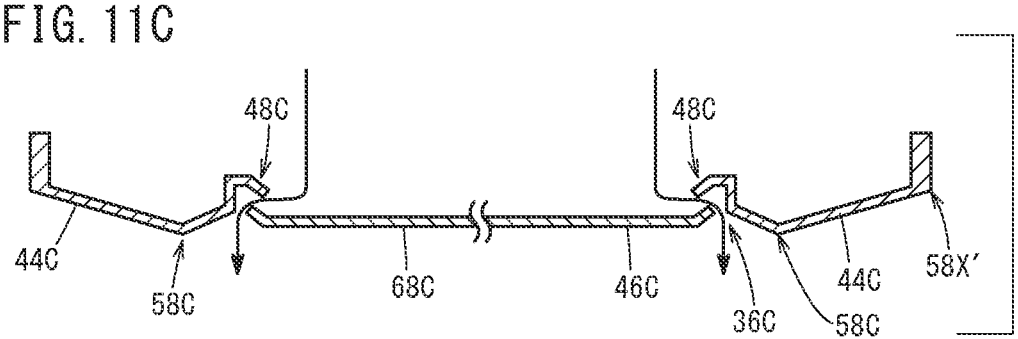

As shown in FIG. 6, the outer marginal member 44C includes a protruding portion (protruding part or barb) 48C that protrudes toward the inner member 46C, in the region where the inner member 46C and the outer marginal member 44C overlap. The protruding portion 48C is provided on the inner margin of the outer marginal member 44C. FIGS. 11A to 11C conceptually show the flow of water. FIG. 11A is a left side view. FIG. 11B is a cross-sectional view of the left-side surface 18C. As shown in FIG. 11A, the protruding portion 48C is formed with an annular shape in a manner to follow along the outer periphery of the inner member 46C. The corner portions of the protruding portion 48C formed with the annular shape are curved as shown in FIG. 11A. Specifically, the protruding portion 48C is formed by linear portions 48CLA, 48CLB, 48CLE, and 48CLF and curved portions 48CCA, 48CCB, 48CCC, and 48CCD. The linear portion 48CLA is a portion following along the bottom surface 18A. The linear portion 48CLB is a portion following along the top surface 18B. The linear portion 48CLE is a portion following along the front surface 18E. The linear portion 48CLF is a portion following along the rear surface 18F. The curved portion 48CCA is positioned near the region corresponding to the edge 20A. The curved portion 48CCB is positioned near the region corresponding to the edge 20B. The curved portion 48CCC is positioned near the region corresponding to the edge 20C. The curved portion 48CCD is positioned near the region corresponding to the edge 20D. Since the protruding portion 48C protruding toward the inner member 46C is included on the inner margin of the outer marginal member 44C, the water flowing into the casing 12 via the ventilation path 36C can flow in the manner described below. For example, water that flows into the portion of the ventilation path 36C corresponding to the linear portion 48CLB collides with the protruding portion 48C, and thereafter reaches the inner surface of the inner member 46C. The water having reached the inner surface of the inner member 46C can flow vertically along the inner surface of the inner member 46C (see FIG. 11B). Furthermore, water that flows into the portion of the ventilation path 36C corresponding to the curved portion 48CCA flows along the surface of the outer marginal member 44C while conforming to the shape of the curved portion 48CCA. Then the water flowing along the surface of the outer marginal member 44C while conforming to the shape of the curved portion 48CCA can flow along the surface of the outer marginal member 44C while conforming to the shape of the linear portion 48CLF. Yet further, water that flows into the portion of the ventilation path 36C corresponding to the curved portion 48CCB flows along the surface of the outer marginal member 44C while conforming to the shape of the curved portion 48CCB. Then the water flowing along the surface of the outer marginal member 44C while conforming to the shape of the curved portion 48CCB can flow along the surface of the outer marginal member 44C while conforming to the shape of the linear portion 48CLE. In this way, the protruding portion 48C realizes the role of a gutter.

The positional relationship between the inner member 46C and the outer marginal member 44C, in the direction from the right-side surface 18D toward the left-side surface 18C, is as described below. Specifically, the portion of the outer marginal member 44C positioned farthest in said direction is positioned on said direction side of the portion of the inner member 46C positioned farthest in said direction. In other words, in the normal direction of the left-side surface 18C, the most-protruding portion of the inner member 46C is positioned backward relative to the most-protruding portion of the outer marginal member 44C. In other words, as shown in FIG. 11B, the inner member 46C is arranged such that an outermost end portion 68C, which is the outermost end of the inner member 46C in the longitudinal direction of the edge 20A, is located more inwardly than an outermost end portion 58C, which is the outermost end of the outer marginal member 44C in the longitudinal direction of the edge 20A. Therefore, when the casing 12 is arranged with the left-side surface 18C in contact with the floor, the outer marginal member 44C contacts the floor but the inner member 46C does not contact the floor. FIG. 11C shows a state in which the casing 12 is arranged with the left-side surface 18C on the bottom side. When water has flowed into the casing 12, this water can be expelled to the outside of the casing 12 via the ventilation path 36C, as shown in FIG. 11C.

The outer marginal member 44D and the outer marginal member 44C have mirror symmetry with respect to the left-right center of the casing 12. Furthermore, the inner member 46D and the inner member 46C have mirror symmetry relative to the left-right center of the casing 12. The positional relationship between the inner member 46D and an outer marginal member 44D, in the direction from the left-side surface 18C toward the right-side surface 18D, is as described below. Specifically, the portion of the outer marginal member 44D positioned farthest in said direction is positioned on said direction side of the portion of the inner member 46D positioned farthest in said direction. In other words, in the normal direction of the right-side surface 18D, the most-protruding portion of the inner member 46D is positioned backward relative to the most-protruding portion of the outer marginal member 44D. In other words, the inner member 46D is arranged such that an outermost end portion 68D (not shown in the drawings), which is the outermost end of the inner member 46D in the longitudinal direction of the edge 20A, is located more inwardly than an outermost end portion 58D (see FIG. 13D), which is the outermost end of the outer marginal member 44D in the longitudinal direction of the edge 20A. In a state where the outer marginal member 44D is fixed to the casing 12, the inner member 46D can be removed. The flow of water occurring when water flows into the casing 12 via the ventilation path 36D is the same as the flow of water occurring when water flows into the casing 12 via the ventilation path 36C.

As shown in FIGS. 7 and 8, a board-shaped member (configurational member) 46E is included on the front surface 18E side. A portion 46Eb of the member 46E positioned on the top surface 18B side overlaps with a portion 25E of the member 25 on the front surface 18E side. The portion 46Eb of the member 46E overlapping with the member 25 is positioned on the inner side of the casing 12 relative to the portion 25E of the member 25 overlapping with the member 46E. The partial ventilation path 36Eb is formed between the portion 46Eb of the member 46E positioned on the top surface 18B side and the portion 25E of the member 25 positioned on the front surface 18E side. In the manner described above, the ventilation path 36E is formed by the partial ventilation path 36Ea and the partial ventilation path 36Eb.

The positional relationship between the member 46E and the outer marginal members 44C and 44D, in the direction from the rear surface 18F toward the front surface 18E, is as described below. Specifically, the portions of the outer marginal members 44C and 44D positioned farthest in said direction are positioned on said direction side of the portion of the member 46E positioned farthest in said direction. In other words, in the normal direction of the front surface 18E, the most-protruding portion of the member 46E is positioned backward relative to the most-protruding portions of the outer marginal members 44C and 44D. In other words, the configurational member 46E is arranged such that the outermost end (outermost surface) of the configurational member 46E in the normal direction of the surface 18E is located more inwardly than outermost end portions 58Ec and 58Ed (see FIG. 13E) of the outer marginal members 44C and 44D in this normal direction. Therefore, when the casing 12 is arranged such that the front surface 18E side contacts the floor, the outer marginal members 44C and 44D contact the floor, but the member 46E does not contact the floor and the ventilation path 36E does not become blocked by the floor. Therefore, according to the present embodiment, even when the casing 12 is arranged such that the front surface 18E side contacts the floor, the air expelled by the blower 52 described further below can be expelled to the outside of the casing 12 via the ventilation path 36E.

As shown in FIGS. 7 and 9, a board-shaped member (configurational member) 46F is included on the rear surface 18F side. The configurational member 46F is arranged such that the outermost end (outer surface) of the configurational member 46F in the normal direction of the surface 18F is located more inwardly than outermost end portions 58Fc and 58Fd (see FIG. 13F) of the outer marginal members 44C and 44D in this normal direction. The partial ventilation path 36Fa is formed between the portion 56*f* described above and the member 46F. The partial ventilation path 36Fa is included in the recessed space 54 described above. Since the partial ventilation path 36Fa is included inside the recessed space 54 and not on the surface of the casing 12, it is difficult for foreign matter to enter into the casing 12 via the partial ventilation path 36Fa. The partial ventilation path 36Fb is formed between a portion of the member 46F positioned on the top surface 18B side and a member 49 included to the top surface 18B side of the member 46F. The member 49 is positioned between the cover portion 32 and the member 46F. In the manner described above, the ventilation path 36F is formed by the partial ventilation path 36Fa and the partial ventilation path 36Fb.

As shown in FIG. 6, the partial ventilation path 36Ac is formed between the portion 56*a* and the outer marginal member 44C. Furthermore, the partial ventilation path 36Ad is formed between the portion 56*a* and the outer marginal member 44D. In the manner described above, the ventilation path 36A is formed by the partial ventilation path 36Ac and the partial ventilation path 36Ad. Since the casing 12 is not arranged with the top surface 18B facing the floor, there are no instances where the casing 12 is arranged such that the bottom surface 18A in which the ventilation path 36A is formed faces upward. Therefore, there is only a low possibility of foreign matter entering into the casing 12 via the ventilation path 36A, which means that there is only a low possibility of this foreign matter reaching a power converting apparatus 17 described further below. In the manner described above, the ventilation path 36A is formed by the partial ventilation path 36Ac and the partial ventilation path 36Ad.

As shown in FIGS. 7 and 10, a portion 46Ea of the member 46E positioned on the bottom surface 18A side overlaps with a portion 56ex of the configurational member 56 on the front surface 18E side. The portion 46Ea of the member 46E overlapping with the configurational member 56 is positioned on the inner side of the casing 12 relative to the portion 56ex of the configurational member 56 overlapping with the member 46E. The partial ventilation path 36Ea is formed between the portion 46Ea of the member 46E positioned on the bottom surface 18A side and the portion 56ex of the configurational member 56 positioned on the front surface 18E side.

The cross-sectional area (opening size) of the ventilation path 36E and the cross-sectional area of the ventilation path 36A differ from each other. More specifically, the cross-sectional area of the ventilation path 36A is smaller than the cross-sectional area of the ventilation path 36E. The cross-sectional area of the ventilation path 36C is equivalent to the cross-sectional area of the ventilation path 36D. The cross-sectional area of the ventilation path 36C and the cross-sectional area of the ventilation path 36E differ from each other. More specifically, the cross-sectional area of the ventilation path 36C is smaller than the cross-sectional area of the ventilation path 36E. The cross-sectional area of the ventilation path 36D and the cross-sectional area of the ventilation path 36E differ from each other. The cross-sectional area of the ventilation path 36D is smaller than the cross-sectional area of the ventilation path 36E. The cross-sectional area of the ventilation path 36E and the cross-sectional area of the ventilation path 36F differ from each other. More specifically, the cross-sectional area of the ventilation path 36F is smaller than the cross-sectional area of the ventilation path 36E. In this way, in the present embodiment, the cross-sectional areas of the ventilation paths 36A, 36C, 36D, and 36F for sucking in air using the blower 52 described further below are set to be relatively small. Therefore, according to the present embodiment, it is possible to restrict foreign matter from entering into the casing 12 via the ventilation paths 36A, 36C, 36D, and 36F. On the other hand, in the present embodiment, the cross-sectional area of the ventilation path 36E for expelling air using the blower 52 described further below is set to be relatively large. Therefore, according to the present embodiment, even in the extremely rare situation where foreign matter has entered into the casing 12, it is possible to effectively expel this foreign matter.

Figure 12A:
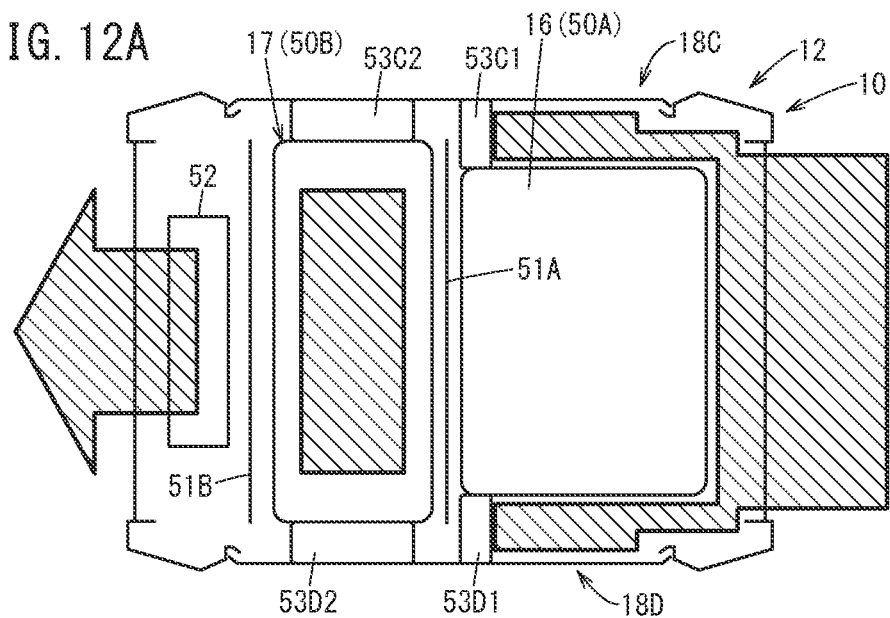
FIGS. 12A and 12B show the containing device according to an embodiment.
Figure 12B:
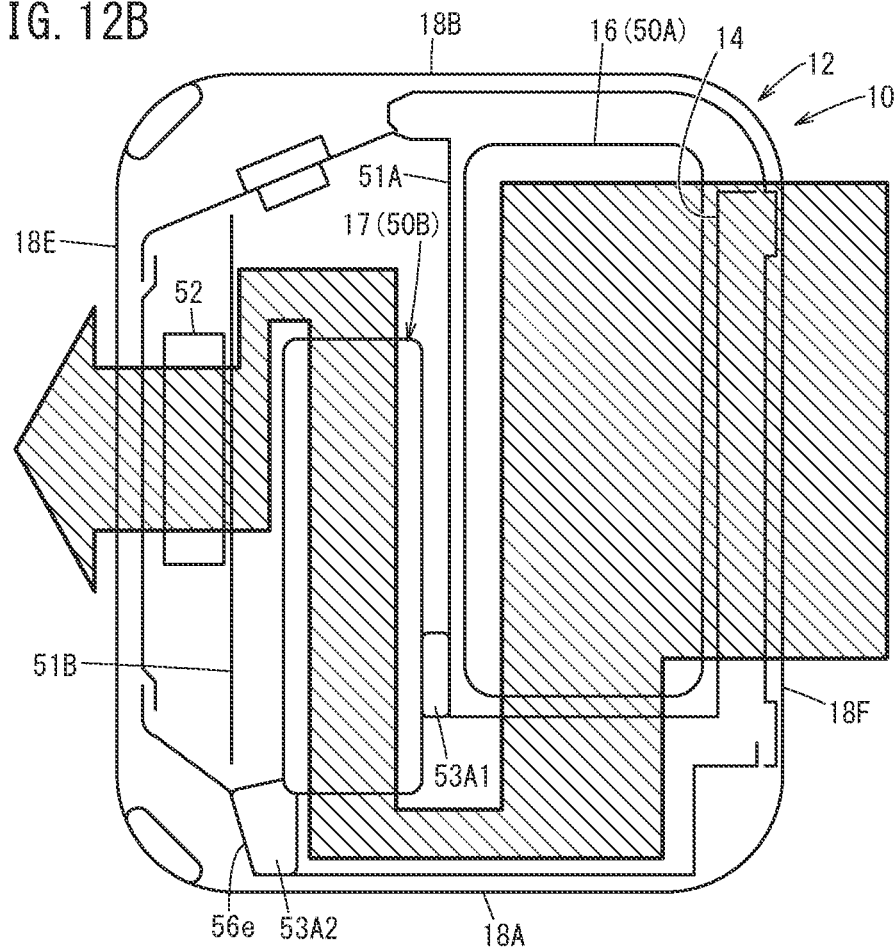

FIGS. 12A and 12B show the containing device according to the present embodiment. FIG. 12A is a horizontal cross-sectional view seen from the top surface 18B side. FIG. 12B is a vertical cross-sectional view seen from the right-side surface 18D side. In FIGS. 12A and 12B, the arrows with hatching conceptually show the flow of air.

As shown in FIGS. 12A and 12B, a plurality of heating bodies 50A and 50B are included. The reference numeral 50 is used when describing a heating body in general, and the reference numerals 50A and 50B are used when describing each individual heating body. Furthermore, the blower (fan) 52 for cooling the heating bodies 50A and 50B is also included in the casing 12. The blower 52 sends air from the right side to the left side in FIGS. 12A and 12B. The heating bodies 50A and 50B are positioned downstream from the ventilation paths 36A, 36C, 36D, and 36F. The heating bodies 50A and 50B are positioned upstream from the blower 52. The heating body 50A is the contained item 16, i.e., a battery, for example, but is not limited to this. The heating body 50B is the power converting apparatus (invertor converter unit) 17, for example. The heating body 50B will reach a higher temperature than the heating body 50A. The heating body 50A is arranged upstream from the heating body 50B. There is a partition wall 51A between the containment chamber 14 in which the heating body 50A is housed and the portion (containment chamber) where the heating body 50B is housed. There is a partition wall 51B between the portion where the heating body 50B is housed and the portion where the blower 52 is housed. As shown in FIG. 12A, a barrier member (sealing material) 53C1 is included between the portion of the heating body 50A on the front surface 18E side and the left-side surface 18C. A barrier member 53D1 is included between the portion of the heating body 50A on the front surface 18E side and the right-side surface 18D. A barrier member 53C2 is included between the heating body 50B and the left-side surface 18C. A barrier member 53D2 is included between the heating body 50B and the right-side surface 18D. As shown in FIG. 12B, a barrier member 53A1 is included between the bottom end portion of the partition wall 51A and the heating body 50B. A barrier member 53A2 is included between the portion of the heating body 50B on the front surface 18E side and the portion 56e. The barrier members 53C1, 53D1, 53C2, 53D2, 53A1, and 53A2 are for blocking the flow of air. The barrier members 53C1, 53D1, 53C2, 53D2, 53A1, and 53A2 can be formed by a foam sealant, for example, but are not limited to this. Since the heating bodies 50A and 50B, the blower 52, the partition walls 51A and 51B, and the barrier members 53A1, 53A2, 53C1, 53C2, 53D1, and 53D2 are arranged this way, the air flows inside the casing 12 as shown by the arrow marks.

Figure 13D:
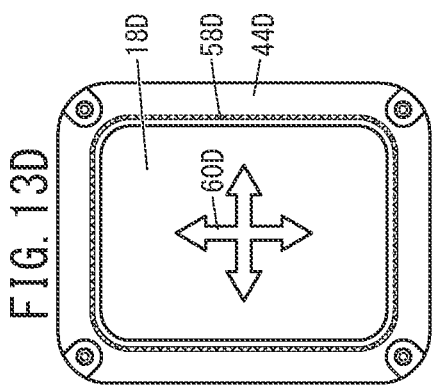
FIGS. 13A, 13B, 13C, 13D, 13E and 13F show six orthogonal views of the containing device according to an embodiment.
Figure 13E:
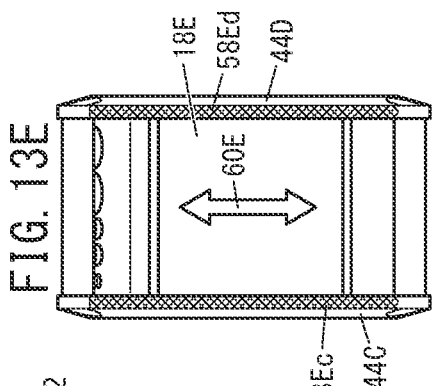
Figure 13B:
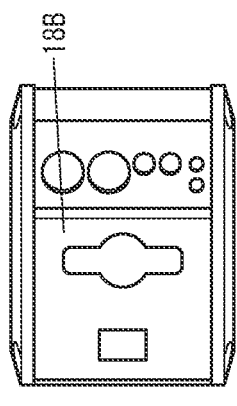
Figure 13C:
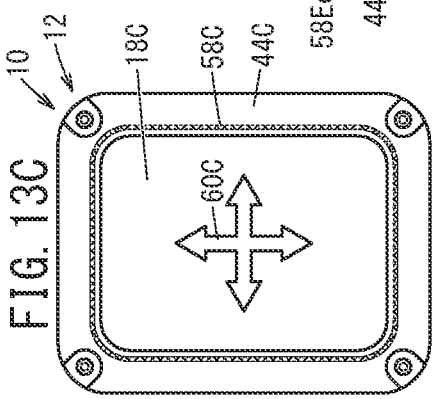
Figure 13A:
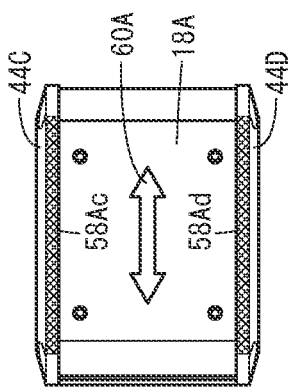
Figure 13F:
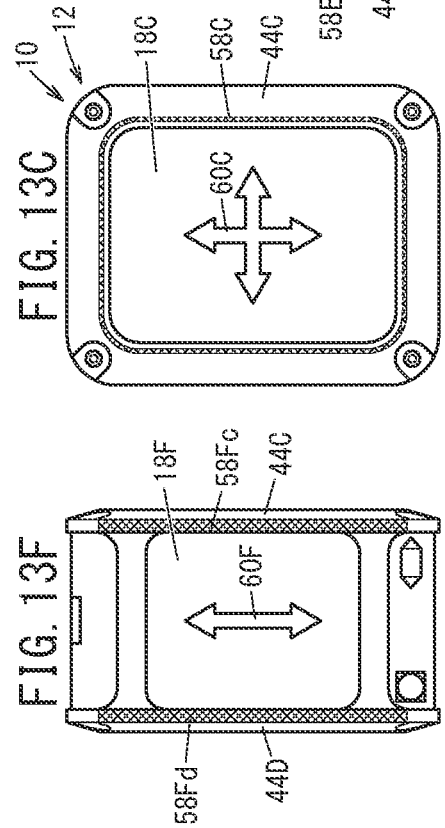

FIGS. 13A and 13F are six orthogonal views of the containing device according to the present embodiment. FIG. 13A is a bottom view, FIG. 13B is a top view, FIG. 13C is a left side view, FIG. 13D is a right side view, FIG. 13E is a front view, and FIG. 13F is a rear view. FIG. 13 shows a state in which the grounding protrusions 38 (see FIGS. 5C to 5F) are removed.

When the casing 12 is arranged such that the bottom surface 18A is in contact with the floor, the positional relationship between the outer marginal members 44C and 44D and the floor, in the direction from the top surface 18B toward the bottom surface 18A, is as described below. Specifically, the portion (region, outermost end portion) 58Ac (see FIG. 14) of the outer marginal member 44C positioned farthest in said direction and the portion (region, outermost end portion) 58Ad of the outer marginal member 44D positioned farthest in said direction are in contact with the floor. These portions 58Ac and 58Ad are linear, as shown in FIG. 13A. Since the entire bottom surface 18A does not contact the floor and the liner portions 58Ac and 58Ad do contact the floor, the frictional force occurring when the casing 12 is slid in the longitudinal direction of these portions 58Ac and 58Ad is relatively small. Accordingly, when the casing 12 is slid in the direction of an arrow mark 60A shown in FIG. 13A, it is possible for the casing 12 to be slid with relatively little force. In this way, when the casing 12 is arranged such that the bottom surface 18A is in contact with the floor, the casing 12 can be slid in the direction from the front surface 18E toward the rear surface 18F with relatively little force. Furthermore, when the casing 12 is arranged such that the bottom surface 18A is in contact with the floor, the casing 12 can be slid in the direction from the rear surface 18F toward the front surface 18E with relatively little force.

Figure 14:
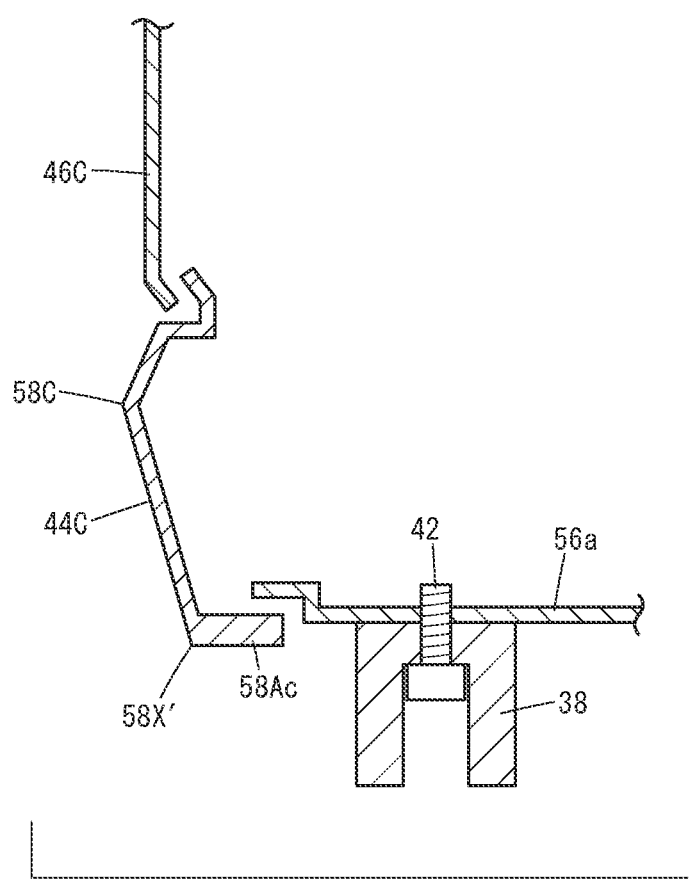
FIG. 14 is a cross-sectional view of a portion of the containing device according to an embodiment.

When the casing 12 is arranged such that the left-side surface 18C is in contact with the floor, the positional relationship between the outer marginal member 44C and the floor, in the direction from the right-side surface 18D toward the left-side surface 18C, is as described below. Specifically, the portion 58C (see FIG. 11C) of the outer marginal member 44C positioned farthest in said direction is in contact with the floor. FIG. 14 is a cross-sectional view of a portion of the containing device according to the present embodiment. FIG. 14 shows a state in which the grounding protrusion 38 is attached to the bottom surface 18A side. As shown in FIG. 13C, the portion 58C is a substantially rectangular frame, that is, a substantially rectangular ring. In other words, the portion 58C is formed to protrude in a ring shape. Since the entire left-side surface 18C is not in contact with the floor and the ring-shaped portion 58C is in contact with the floor, the frictional force is relatively low when the casing 12 slides. Accordingly, when the casing 12 is slid in the direction of an arrow mark 60C shown in FIG. 13C, the casing 12 can be slid with relatively little force. In this way, when the casing 12 is arranged such that the left-side surface 18C is in contact with the floor, the casing 12 can be slid in the direction from the front surface 18E toward the rear surface 18F with relatively little force. Furthermore, when the casing 12 is arranged such that the left-side surface 18C is in contact with the floor, the casing 12 can be slid in the direction from the rear surface 18F toward the front surface 18E with relatively little force. When the casing 12 is arranged such that the left-side surface 18C is in contact with the floor, the casing 12 can be slid in the direction from the bottom surface 18A toward the top surface 18B with relatively little force. When the casing 12 is arranged such that the left-side surface 18C is in contact with the floor, the casing 12 can be slid in the direction from the top surface 18B toward the bottom surface 18A with relatively little force.

When the casing 12 is arranged such that the left-side surface 18C is in contact with the floor, the ring-shaped portion 58C contacts the floor, and therefore the air intake via the ventilation path 36C included in the left-side surface 18C is restricted. Due to this, in such a case, foreign matter is restricted from entering into the casing 12 via the ventilation path 36C.

When the casing 12 is arranged such that the right-side surface 18D is in contact with the floor, the positional relationship between the outer marginal member 44D and the floor, in the direction from the left-side surface 18C toward the right-side surface 18D, is as described below. Specifically, the portion 58D of the outer marginal member 44D positioned farthest in said direction is in contact with the floor. The right-side surface 18D and the left-side surface 18C have mirror symmetry with respect to the left-right center of the casing 12. Accordingly, when the casing 12 is arranged such that the right-side surface 18D is in contact with the floor, the casing 12 can be slid with relatively little force, in the same manner as when the casing 12 is arranged such that the left-side surface 18C is in contact with the floor. Furthermore, when the casing 12 is arranged such that the right-side surface 18D is in contact with the floor, foreign matter is restricted from entering into the casing 12 via the ventilation path 36D, in the same manner as when the casing 12 is arranged such that the left-side surface 18C is in contact with the floor.

When the casing 12 is arranged such that the front surface 18E is in contact with the floor, the positional relationship between the outer marginal members 44C and 44D and the floor, in the direction from the rear surface 18F toward the front surface 18E, is as described below. Specifically, the outermost end portion 58Ec, which is the portion of the outer marginal member 44C positioned farthest in said direction, and the outermost end portion 58Ed, which is the portion of the outer marginal member 44D positioned farthest in said direction, are in contact with the floor. These portions 58Ec and 58Ed are linear, as shown in FIG. 13E. Since the entire front surface 18E is not in contact with the floor and the linear portions 58Ec and 58Ed are in contact with the floor, the frictional force is relatively small when the casing 12 is slid in the longitudinal direction of these portions 58Ec and 58Ed. Accordingly, when the casing 12 is slid in the direction of an arrow mark 60E shown in FIG. 13E, it is possible for the casing 12 to be slid with relatively little force. In this way, when the casing 12 is arranged such that the front surface 18E is in contact with the floor, the casing 12 can be slid in the direction from the bottom surface 18A toward the top surface 18B with relatively little force. Furthermore, when the casing 12 is arranged such that the front surface 18E is in contact with the floor, the casing 12 can be slid in the direction from the top surface 18B toward the bottom surface 18A with relatively little force.

When the casing 12 is arranged such that the rear surface 18F is in contact with the floor, the positional relationship between the outer marginal members 44C and 44D and the floor, in the direction from the front surface 18E toward the rear surface 18F, is as described below. Specifically, the portion (outermost end portion) 58Fc of the outer marginal member 44C positioned farthest in said direction and the portion (outermost end portion) 58Fd of the outer marginal member 44D positioned farthest in said direction are in contact with the floor. These portions 58Fc and 58Fd are linear, as shown in FIG. 13F. Since the entire rear surface 18F is not in contact with the floor and the linear portions 58Fc and 58Fd are in contact with the floor, the frictional force is relatively small when the casing 12 is slid in the longitudinal direction of these portions 58Fc and 58Fd. Accordingly, when the casing 12 is slid in the direction of an arrow mark 60F shown in FIG. 13F, it is possible for the casing 12 to be slid with relatively little force. In this way, when the casing 12 is arranged such that the rear surface 18F is in contact with the floor, the casing 12 can be slid in the direction from the bottom surface 18A toward the top surface 18B with relatively little force. Furthermore, when the casing 12 is arranged such that the rear surface 18F is in contact with the floor, the casing 12 can be slid in the direction from the top surface 18B toward the bottom surface 18A with relatively little force.

Figure 15:
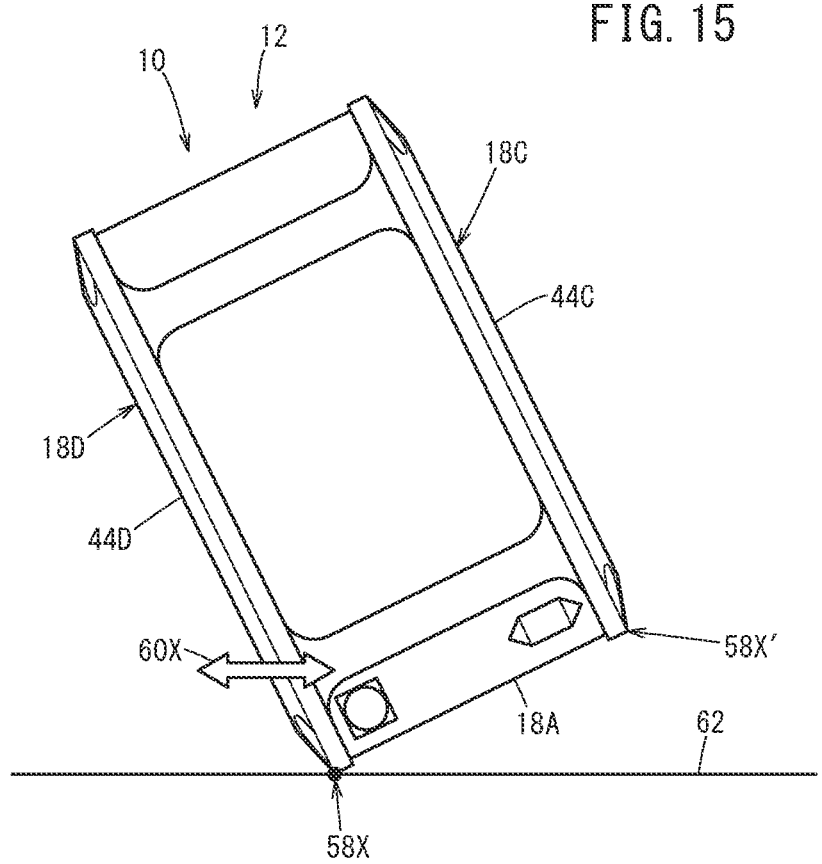
FIG. 15 shows a state in which the casing is inclined.

FIG. 15 shows a state in which the casing is inclined. FIG. 15 shows a state in which the casing 12 is inclined such that only the region corresponding to the edge 20G, which is positioned at the region where the bottom surface 18A and the right-side surface 18D intersect, is in contact with a floor 62. When the casing 12 is inclined in this way, the positional relationship between the outer marginal member 44D and the floor 62, in the direction from the casing 12 toward the floor 62, is as described below. Specifically, a portion 58X of the outer marginal member 44D positioned farthest in said direction is in contact with the floor 62. This portion 58X is linear. Since the portion 58X in contact with the floor 62 is linear, the frictional amount is relatively small when the casing 12 is slid in a direction intersecting the longitudinal direction of this portion 58X. Accordingly, when the casing 12 is slid in the direction of an arrow mark 60X shown in FIG. 15, the casing 12 can be slid with relatively little force. When the casing 12 is inclined to the opposite side, the positional relationship between the outer marginal member 44C and the floor 62, in the direction from the casing 12 toward the floor 62, is as described below. Specifically, a portion 58X' of the outer marginal member 44C positioned farthest in said direction is in contact with the floor 62. This portion 58X' is linear. Since the portion 58X' in contact with the floor 62 is linear, the frictional amount is relatively small when the casing 12 is slid in a direction intersecting the longitudinal direction of this portion 58X'. Accordingly, even in a case where the casing 12 is inclined to the opposite side, when the casing 12 is slid in the direction of the arrow mark 60X shown in FIG. 15, the casing 12 can be slid with relatively little force.

Figure 16:
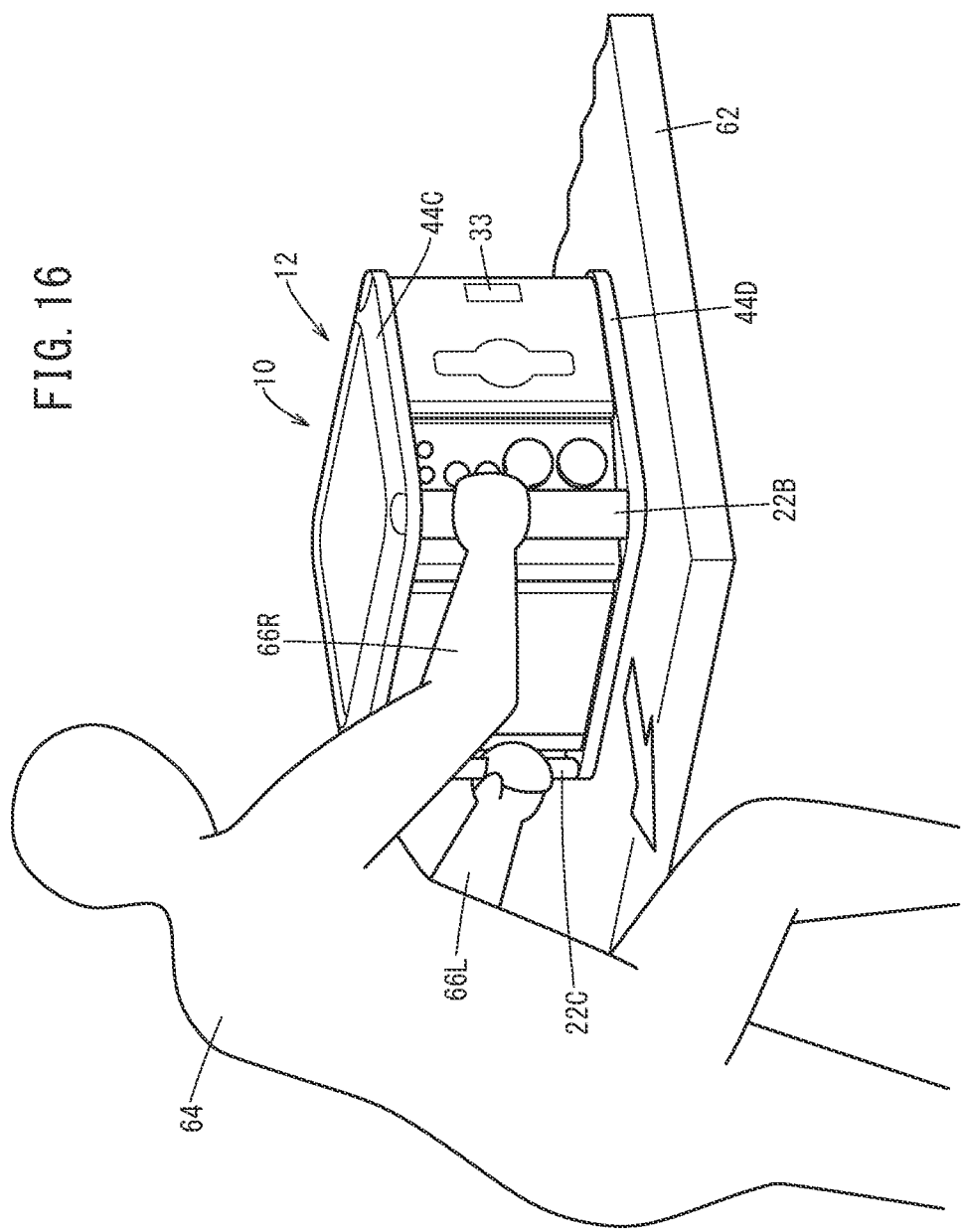
FIG. 16 shows an example of a case of transporting the containing device according to an embodiment.

FIG. 16 shows an example of a case where the containing device according to the present embodiment is transported. FIG. 16 shows an example of a case in which the casing 12 is arranged on the floor 62 such that the right-side surface 18D is on the bottom. The floor 62 shown in FIG. 16 is a loading platform or the like of an automobile, for example, but is not limited to this. FIG. 16 shows an example of a case in which the height of the floor 62 on which the casing 12 is arranged is greater than the height of the floor (not shown in the drawings) on which a user 64 is standing. FIG. 16 shows an example of a case in which the handle portion 22B is gripped by a right hand 66R of the user 64, and the handle portion 22C is gripped by a left hand 66L of the user 64. While gripping the handle portions 22B and 22C, the user 64 can pull the containing device 10 out from the loading platform or the like of the automobile.

Figure 17:
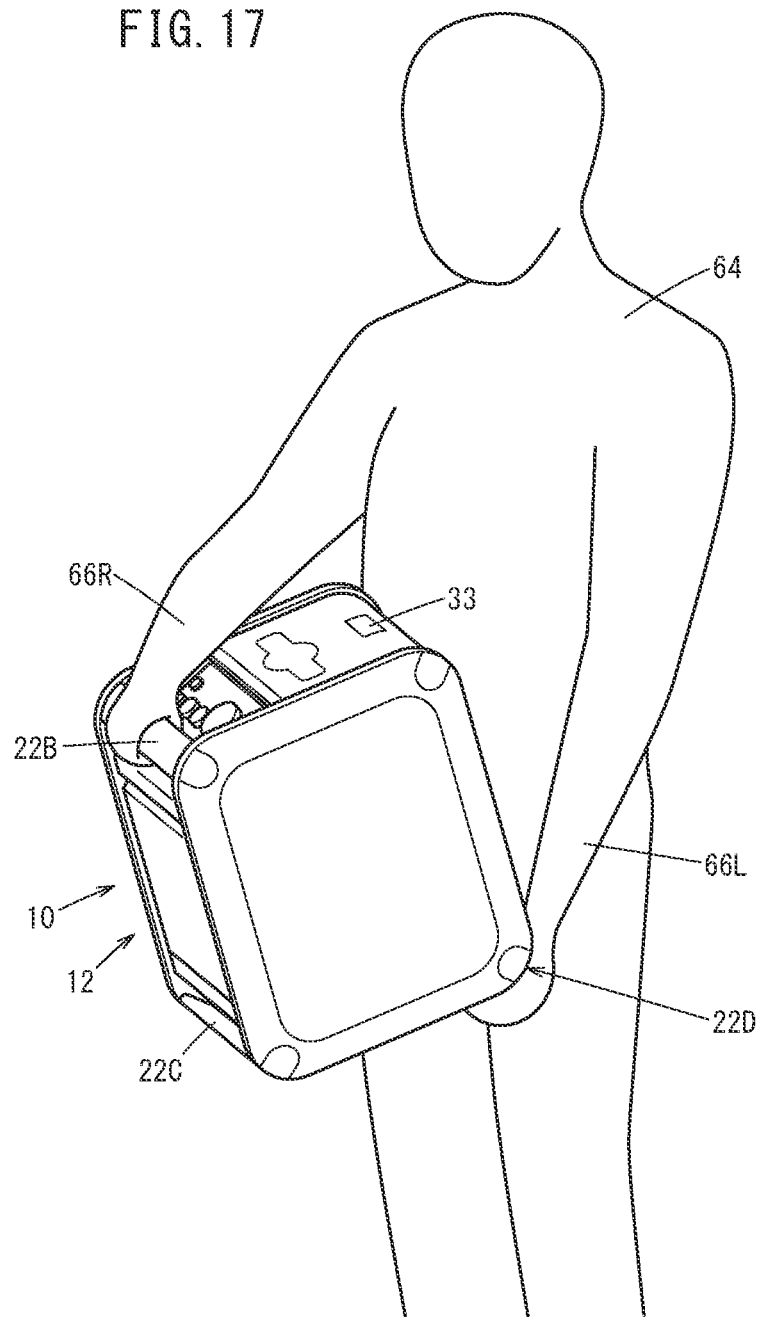
FIG. 17 shows an example of a case of transporting the containing device according to an embodiment.

FIG. 17 shows an example of a case where the containing device according to the present embodiment is transported. FIG. 17 shows an example of a case in which the user 64 carries the containing device 10 alone. FIG. 17 shows an example of a case where the handle portion 22B is gripped by the right hand 66R of the user 64 and the handle portion 22D is gripped by the left hand 66L of the user 64. While gripping the handle portions 22B and 22D, the user 64 can carry the containing device 10.

Figure 18:
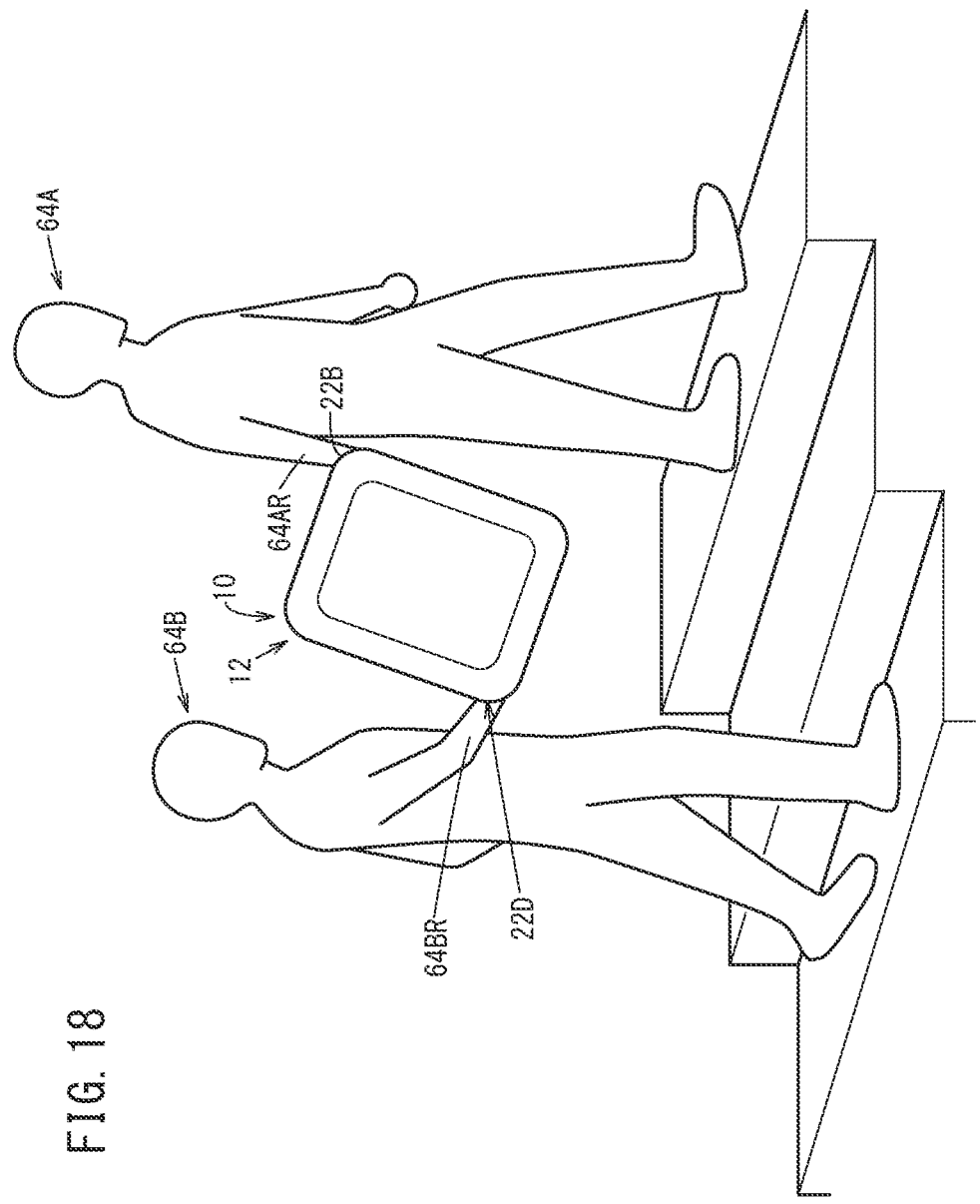
FIG. 18 shows an example of a case of transporting the containing device according to an embodiment.

FIG. 18 shows an example of a case where the containing device according to the present embodiment is transported. FIG. 18 shows an example where two users 64A and 64B cooperate to carry the containing device 10. FIG. 18 shows an example of a case where, when climbing a staircase, the user 64A is positioned in front and the user 64B is positioned to the rear. FIG. 18 shows an example of a case in which the handle portion 22B is gripped by a right hand 64AR of the user 64A and the handle portion 22D is gripped by a right hand 64BR of the user 64B. The users 64A and 64B can carry the containing device 10 in this way as well.

FIG. 19 shows an example of inserting or removing the contained item to and from the containment chamber. FIG. 19 shows an example of a case in which the casing 12 is arranged such that the bottom surface 18A faces the floor 62. FIG. 19 shows an example of a case in which the contained item 16 is inserted or removed into or from the containment chamber 14 in the depth direction of the containment chamber 14 (in the vertical direction). The user can insert or remove the contained item 16 into or from the containment chamber 14 in this way.

FIG. 20 shows an example of inserting the contained item into the containment chamber. FIG. 20 shows an example of a case where the casing 12 is arranged such that the bottom surface 18A faces the floor 62. As described above, the opening 14a continuous with the containment chamber 14, or the peripheral edge portion 14b of the opening 14a continuous with the containment chamber 14, is positioned at the portion corresponding to the edge 20A. The handle portions 22B to 22D are not provided at the position corresponding to the edge 20A. Since the opening 14a continuous with the containment chamber 14, or the peripheral edge portion 14b of the opening 14a continuous with the containment chamber 14, is positioned at the portion corresponding to the edge 20A, the portion of the inner side surface of the containment chamber 14 on the rear surface 18F side can function as a guide portion (guiding portion) when inserting the contained item 16. In this way, the contained item 16 can be inserted into the containment chamber 14 from a direction inclined relative to the depth direction of the containment chamber 14. In other words, the contained item 16 can be inserted into the containment chamber 14 from a direction other than the depth direction of the containment chamber 14.

FIG. 21 shows an example of inserting the contained item into the containment chamber. FIG. 21 shows an example of a case in which the casing 12 is arranged such that the front surface 18E faces the floor 62. As described above, the opening 14a continuous with the containment chamber 14, or the peripheral edge portion 14b of the opening 14a continuous with the containment chamber 14, is positioned at the portion corresponding to the edge 20A. A handle portion 22 is not provided at the portion corresponding to the edge 20A. Since the opening 14a continuous with the containment chamber 14, or the peripheral edge portion 14b of the opening 14a continuous with the containment chamber 14, is positioned at the portion corresponding to the edge 20A, the portion of the inner side surface of the containment chamber 14 on the rear surface 18F side can function as the guide portion when inserting the contained item 16. In this way, the contained item 16 can be inserted into the containment chamber 14 from a direction inclined relative to the depth direction of the containment chamber 14. In other words, the contained item 16 can be inserted into the containment chamber 14 from a direction other than the depth direction of the containment chamber 14.

In this way, according to the present embodiment, since the opening 14a continuous with the containment chamber 14, or the peripheral edge portion 14b of the opening 14a continuous with the containment chamber 14 are positioned at the portion corresponding to the edge 20A and the handle portions 22B to 22D are not positioned at the portion corresponding to the edge 20A, the degree of freedom when inserting the contained item 16 into the containment chamber 14 can be improved.

The above describes a preferred embodiment of the present invention, but the present invention is not limited to the above-described embodiment, and various modifications could be adopted therein without departing from the essence and gist of the present invention.

For example, in the above embodiment, an example is described of a case in which the ventilation paths 36A, 36C, 36D, and 36F are intake paths and the ventilation path 36E is an exhaust path, but the present invention is not limited to this. As an example, the ventilation paths 36A, 36C, 36D, and 36F may be exhaust paths and the ventilation path 36E may be an intake path. In this case, the blower 52 sends the air from the left side toward the right side in FIGS. 12A and 12B.

Furthermore, in the above embodiment, an example is described of a case in which the containing device 10 can charge the contained item 16 and supply the electric power stored in the contained item 16 (a battery) to an external device. That is, an example is described of a case in which the containing device (10) is a charging and electric power supply device. However, the present invention is not limited to this. As an example, the containing device (10) may be capable of charging the contained item (16) (the battery), while being unable to output the electric power stored in the contained item (16) (a battery), to an external device. In other words, the containing device (10) may be a charging device. Furthermore, the containing device (10) may be capable of supplying electric power stored in the contained item (16) (the battery) to the external device, while being unable to charge the contained item (16) (the battery). In other words, the containing device (10) may be a power supply device.

The following is a summary of the embodiments described above.

The containing device (10) includes the casing (12) that has a substantially polyhedral shape and includes the six substantially quadrangular surfaces (18A to 18F) facing different directions from each other, and the containing portion (14) that is formed in the casing and contains the contained item (16) in an insertable and removable manner, wherein the opening (14a) continuous with the containing portion, or the peripheral edge portion (14b) of the opening continuous with the containing portion, is arranged at a position corresponding to the first edge (20A), which is one of the plurality of edges (20A to 20L) forming the polyhedron (23) corresponding to the casing. According to such a configuration, it is possible to improve the degree of freedom for inserting or removing the contained item. Furthermore, according to such a configuration, it is easy to access the containing portion (opening) from two surfaces (two loading states), compared to a device in which the opening is arranged in the center or the like of the surface.

The polyhedron may include the three edges (20B to 20D) that are parallel to the first edge, and the containing device may further include the first handle portion (22B) and the second handle portion (22C, 22D) at positions corresponding to the second edge (20B) and the third edge (20C, 20D), which are two edges among the three edges of the polyhedron. According to such a configuration, it is possible to individually grip handle portions at two locations with the left and right hands.

The second edge and the third edge (20C) may be arranged to be edges that are adjacent to each other. According to such a configuration, it is possible to grip the first handle portion and the second handle portion in a state where these handles can be seen.

The first edge may be arranged at a position sandwiched between the second edge and the third edge (20D). According to such a configuration, the first handle portion and the second handle portion can be arranged at diagonal positions sandwiching the opening, and the casing can be held stably.

The containing device may further include the third handle portion (22C, 22D) at a position corresponding to the fourth edge (20C, 20D), which is the remaining edge among the three edges of the casing. According to such a configuration, handle portions are arranged at three edges where the opening and the peripheral edge portion are not formed, among four parallel edges, and therefore it is possible to easily grip at least one handle portion from the direction of any of the four side surfaces of the casing.

The containing device may include the handle portion (22B) that has the gripping portion (21B) whose cross section is formed with an annular shape, at a position corresponding to the fifth edge (20B) adjacent to the first edge, among the three edges of the polyhedron.

The containing device may further include the recessed portion (24) formed by depressing an outer surface of the casing, at a position on an inner side of the casing relative to the gripping portion (21B); and the terminal (26, 28) providing a connection between the inside and outside of the casing, in the recessed portion. According to such a configuration, the terminals and power lines connected to the terminals can be prevented from sticking out from the surfaces. Furthermore, according to such a configuration, the terminals and the power lines connected to the terminals can be protected by the gripping portions.

The containing device may further include the cover portion (32) configured to cover the opening and is provided to be pivotable, centered on the pivoting shaft (31), relative to the casing, wherein the pivoting shaft may be arranged at a position avoiding the first edge. Assuming a case where the pivoting shaft is arranged on the first edge, the removal of the contained item upward or the insertion thereof from above would be obstructed, but according to the above configuration, it is possible to prevent obstruction when removing the contained item upward or inserting it from above.

The pivoting shaft may be arranged at a position avoiding all of the edges among the plurality of edges (20A to 20L). According to such a configuration, for example, it is possible to arrange the handle portions 22B at positions corresponding to the plurality of edges forming the polyhedron corresponding to the casing, so as to efficiently realize other uses.

The containing device may further include the two outer marginal members (44C, 44D) at positions corresponding to the two surfaces (18C, 18D) whose normal directions are a longitudinal direction of the first edge, among the six surfaces of the casing, the two outer marginal members respectively forming outer margins of the two surfaces. According to such a configuration, it is possible to improve the strength of the casing to outside force.

The containing device may include the connecting portion (22B, 22C) configured to connect the two outer marginal members to each other, at a position corresponding to the edge (20B, 20C) parallel to the first edge, among the plurality of edges. According to such a configuration, it is possible to improve the rigidity of the casing while arranging the opening or peripheral edge portion at the first edge.

The containing device may further include the inner members (46C, 46D), on the inner sides of the outer marginal members, wherein the inner members may be arranged in a manner that the outermost end portions (68C, 68D), which are the outermost ends of the inner members in the longitudinal direction of the first edge, are located more inwardly than the outermost end portions (58C, 58D), which are the outermost ends of the outer marginal members in the longitudinal direction of the first edge.

The outermost end portion of the outer marginal member may be formed protruding with an annular shape.

The containing device may include the configurational members (32, 46E, 46F, 56) at positions corresponding to four surfaces (18A, 18B, 18E, 18F) whose normal directions intersect with the longitudinal direction of the first edge, among the six surfaces of the casing, wherein the outermost end portions of the configurational members, in the respective normal directions of the four surfaces, may be arranged to be located more inwardly than the outermost end portions (58Ac, 58Ad, 58Ec, 58Ed, 58Fc, 58Fd) of the outer marginal members in the respective normal directions of the four surfaces.

The containing device includes the casing that has the substantially polyhedral shape and includes the six substantially quadrangular surfaces facing different directions from each other, the containing portion that is formed in the casing and contains the contained item in an insertable and removable manner, the opening continuous with the containing portion, the two outer marginal members provided at positions corresponding to the two surfaces that are parallel to each other among the six surfaces of the casing, the two outer marginal members forming outer margins of the two surfaces, respectively, and the connecting portion configured to connect the two outer marginal members to each other, provided at a position corresponding to the edge parallel to the normal direction of the two surfaces, among the plurality of edges forming the polyhedron corresponding to the casing.

REFERENCE SIGNS LIST

10: containing device
12: casing
14: containment chamber
14a: opening
14b: peripheral edge portion
16: contained item
17: power converting apparatus
18A: bottom surface
18B: top surface
18C: left-side surface
18D: right-side surface
18E: front surface
18F: rear surface
20: cover portion
20A to 20L: edge
21B, 21C: gripping portion
22B to 22D: handle portion
23: polyhedron
24: recessed portion
25, 46E, 46F, 49, 56: member
25E, 46Ea, 46Eb, 56a, 56e, 56ex, 56f: portion
26: USB power output terminal
28: AC power output terminal
27, 29: cap
30: indicator
31: pivoting shaft
32: cover portion
32a: curved portion
33: open button
34A: AC power input terminal
34B: DC power input terminal
36A, 36C, 36D, 36E, 36F: ventilation path
36Ac, 36Ad, 36Ea, 36Eb, 36Fa, 36Fb: partial ventilation path
38: grounding protrusion
40: screw hole
42: screw
44C, 44D: outer marginal member
46C, 46D: inner member
47: fixing mechanism
48C: protruding portion
48CCA, 48CCB, 48CCC, 48CCD: curved portion
48CLA, 48CLB, 48CLE, 48CLF: linear portion
50A, 50B: heating body
51A, 51B: partition wall
52: blower
53A1, 53A2, 53C1, 53C2, 53D1, 53D2: barrier member
54: recessed space
57c, 57d: opening
58Ac, 58Ad, 58C, 58D, 58Ec, 58Ed, 58Fc, 58Fd, 58X: portion
59: slit
60A, 60C to 60F, 60X: arrow mark
62: floor
64, 64A, 64B: user
64AR, 64BR, 66R: right hand
64RL, 66L: left hand
68C: outermost end portion

What is claim is:

1. A containing device comprising:
a casing that has a substantially polyhedral shape and includes six substantially quadrangular surfaces facing different directions from each other; and
a containing portion that is formed in the casing and contains a contained item in an insertable and removable manner,
wherein an opening continuous with the containing portion, or a peripheral edge portion of an opening continuous with the containing portion, is arranged at a position corresponding to a first edge, which is one of a plurality of edges forming a polyhedron corresponding to the casing,
the containing device further comprising
two outer marginal members at positions corresponding to two surfaces whose normal directions are a longitudinal direction of the first edge, among the six surfaces of the casing, the two outer marginal members respectively forming outer margins of the two surfaces, and
configurational members at positions corresponding to four surfaces whose normal directions intersect with the longitudinal direction of the first edge, among the six surfaces of the casing,
wherein outermost end portions of the configurational members, in the respective normal directions of the four surfaces, are arranged to be located more inwardly than outermost end portions of the outer marginal members in the respective normal directions of the four surfaces.

2. The containing device according to claim 1, wherein the polyhedron includes three edges that are parallel to the first edge, and
the containing device further comprises a first handle portion and a second handle portion at positions corresponding to a second edge and a third edge, which are two edges among the three edges of the polyhedron.

3. The containing device according to claim 2, wherein the second edge and the third edge are arranged to be edges that are adjacent to each other.

4. The containing device according to claim 2, wherein the first edge is arranged at a position sandwiched between the second edge and the third edge.

5. The containing device according to claim 2, further comprising a third handle portion at a position corresponding to a fourth edge, which is a remaining edge among the three edges of the casing.

6. The containing device according to claim 2, comprising a handle portion that has a gripping portion whose cross section is formed with an annular shape, at a position corresponding to a fifth edge adjacent to the first edge, among the three edges of the polyhedron.

7. The containing device according to claim 6, further comprising:
a recessed portion formed by depressing an outer surface of the casing, at a position on an inner side of the casing relative to the gripping portion; and a terminal providing a connection between inside and outside of the casing, in the recessed portion.

8. The containing device according to claim 1, further comprising a cover portion configured to cover the opening and provided to be pivotable, centered on a pivoting shaft, relative to the casing,
wherein the pivoting shaft is arranged at a position avoiding the first edge.

9. The containing device according to claim 8, wherein the pivoting shaft is arranged at a position avoiding all of the edges among the plurality of edges.

10. The containing device according to claim 1, comprising a connecting portion configured to connect the two outer marginal members to each other, at a position corresponding to an edge parallel to the first edge, among the plurality of edges.

11. The containing device according to claim 1, further comprising inner members, on inner sides of the outer marginal member,
wherein the inner members are arranged in a manner that outermost end portions, which are outermost ends of the inner members in the longitudinal direction of the first edge, are located more inwardly than outermost end portions, which are outermost ends of the outer marginal members in the longitudinal direction of the first edge.

12. The containing device according to claim 11, wherein the outermost end portion of the outer marginal member is formed protruding with an annular shape.

13. The containing device according to claim 1, wherein the contained item is an electrical energy storage device.

14. A containing device comprising:
a casing that has a substantially polyhedral shape and includes six substantially quadrangular surfaces facing different directions from each other;
a containing portion that is formed in the casing and contains a contained item in an insertable and removable manner;
an opening continuous with the containing portion;
two outer marginal members provided at positions corresponding to two surfaces that are parallel to each other among the six surfaces of the casing, the two outer marginal members forming outer margins of the two surfaces, respectively;
a connecting portion configured to connect the two outer marginal members to each other, provided at a position corresponding to an edge parallel to a normal direction of the two surfaces, among a plurality of edges forming a polyhedron corresponding to the casing; and
configurational members at positions corresponding to four surfaces except the two surfaces among the six surfaces of the casing,
wherein outermost end portions of the configurational members, in the respective normal directions of the four surfaces, are arranged to be located more inwardly than outermost end portions of the outer marginal members in the respective normal directions of the four surfaces.

\* \* \* \* \*